(12) United States Patent
Cheng et al.

(10) Patent No.: US 11,441,221 B2
(45) Date of Patent: Sep. 13, 2022

(54) METHOD OF PERFORMING ATOMIC LAYER DEPOSITION

(71) Applicant: Taiwan Semiconductor Manufacturing Co., Ltd., Hsinchu (TW)

(72) Inventors: Po-Hsien Cheng, Hsinchu (TW); Chung-Ting Ko, Kaohsiung (TW); Tsung-Hsun Yu, Hsinchu (TW); Tze-Liang Lee, Hsinchu (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 182 days.

(21) Appl. No.: 17/018,797

(22) Filed: Sep. 11, 2020

(65) Prior Publication Data

US 2021/0262090 A1   Aug. 26, 2021

Related U.S. Application Data

(60) Provisional application No. 62/981,794, filed on Feb. 26, 2020.

(51) Int. Cl.
*H01L 21/02* (2006.01)
*H01L 21/033* (2006.01)
*C23C 16/455* (2006.01)
*C23C 16/40* (2006.01)
*H01L 21/8238* (2006.01)

(52) U.S. Cl.
CPC ...... *C23C 16/45553* (2013.01); *C23C 16/403* (2013.01); *H01L 21/0228* (2013.01); *H01L 21/02178* (2013.01); *H01L 21/0332* (2013.01); *H01L 21/0337* (2013.01); *H01L 21/823842* (2013.01)

(58) Field of Classification Search
None
See application file for complete search history.

(56) References Cited

U.S. PATENT DOCUMENTS

| | | |
|---|---|---|
| 10,062,784 B1 | 8/2018 | Lee et al. |
| 10,760,158 B2 | 9/2020 | Shanbhag et al. |
| 2021/0032750 A1* | 2/2021 | Wu .................. H01L 21/02178 |
| 2021/0115557 A1* | 4/2021 | Ko ..................... H01L 21/6719 |

FOREIGN PATENT DOCUMENTS

| | | |
|---|---|---|
| TW | 201839863 A | 11/2018 |
| TW | 201936972 A | 9/2019 |

OTHER PUBLICATIONS

Moshe, Hagay et al., "Atomic Layer Deposition on Self-Assembled-Monolayers," Materials Science—Advanced Topics, Chapter 3, http://dx.doi.org/10.5772/54814, Jun. 10, 2013, pp. 63-84.

* cited by examiner

*Primary Examiner* — Asok K Sarkar
(74) *Attorney, Agent, or Firm* — Slater Matsil, LLP

(57) ABSTRACT

In an embodiment, a method of manufacturing a semiconductor device includes preparing a deposition processing chamber by flowing first precursors to form a dielectric coat along an inner sidewall of the deposition processing chamber and flowing a second precursor to form a hydrophobic layer over the dielectric coat. In addition one or more deposition cycles are performed. Next, the second precursor is flowed again to repair the hydrophobic layer.

20 Claims, 16 Drawing Sheets

METHOD OF PERFORMING ATOMIC LAYER DEPOSITION

PRIORITY CLAIM AND CROSS-REFERENCE

This application claims the benefit of U.S. Provisional Application No. 62/981,794, filed on Feb. 26, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers (e.g., removing portions of the various material layers) using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
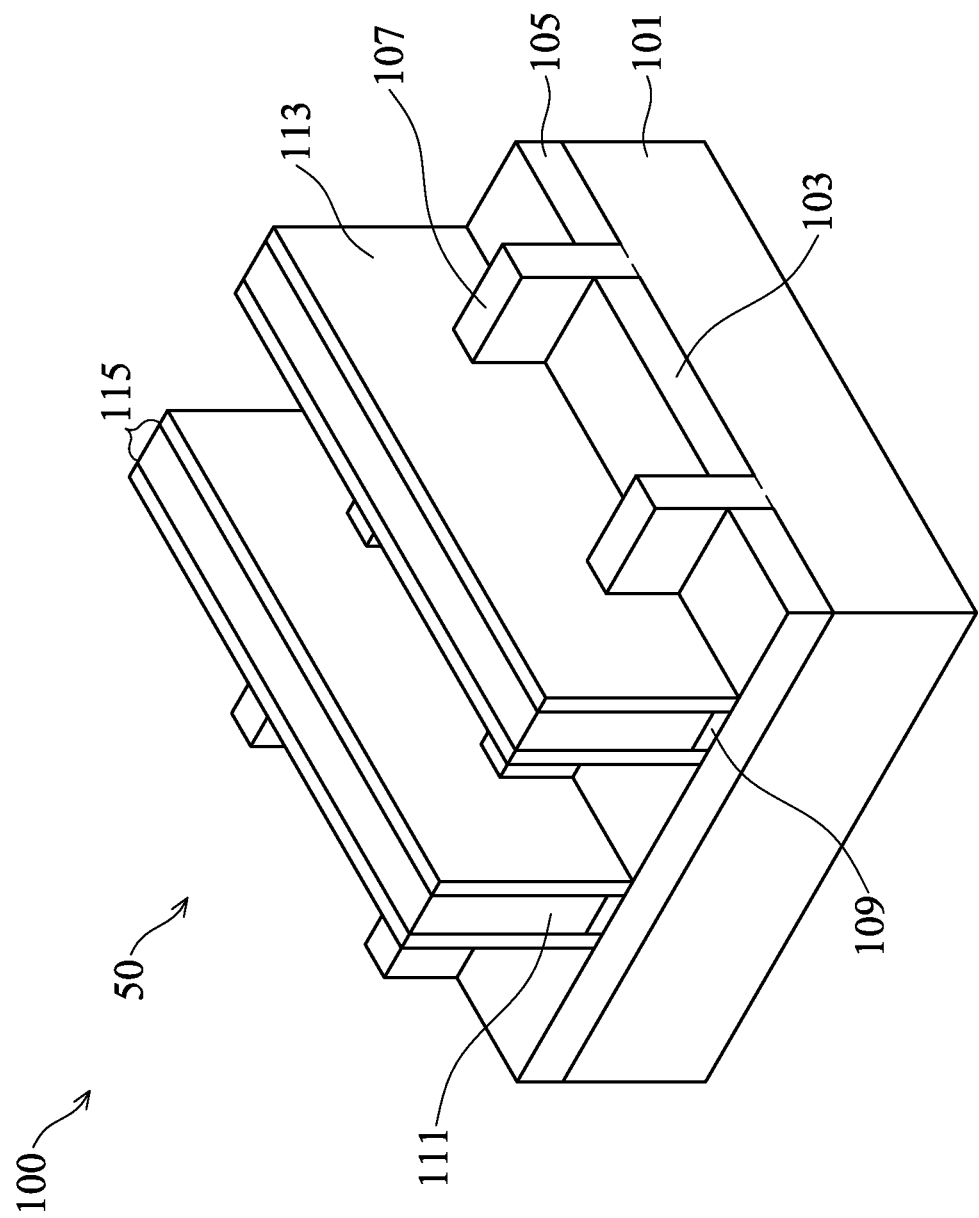
FIGS. 1 and 2 illustrate perspective views of intermediate steps in the formation of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular examples including integrated circuits comprising transistors, such as Fin field-effect transistor (FinFET) devices, and interconnect structures. However, embodiments are not limited to the examples provided herein, and the ideas may be implemented in a wide array of embodiments.

FIG. 1 illustrates a perspective view of a semiconductor device 50 such as a FinFET device formed on a wafer 100. In an embodiment the semiconductor device 50 comprises a substrate 101 and first trenches 103. The substrate 101 may be a semiconductor substrate, such as a bulk semiconductor, a semiconductor-on-insulator (SOI) substrate, or the like, which may be doped (e.g., with a p-type or an n-type dopant) or undoped. The substrate 101 may be part of or formed over the wafer 100, which may be a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 101 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

Fins 107 are formed in the substrate 101. The fins 107 are semiconductor strips. In some embodiments, the fins 107 may be formed in the substrate 101 by masking and etching the first trenches 103 in the substrate 101. The etching may be any acceptable etch process, such as a reactive ion etch (RIE), neutral beam etch (NBE), the like, or a combination thereof. The etch may be anisotropic.

The masking and etching process forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 illustrates two fins 107 formed from the substrate 101, any number of fins 107 may be utilized.

Once the first trenches 103 and the fins 107 have been formed, the first trenches 103 may be filled with a dielectric material, and the dielectric material may be recessed within the first trenches 103 to form Shallow Trench Isolation (STI) regions 105. The dielectric material may be an oxide material, a high-density plasma (HDP) oxide, or the like. The dielectric material may be a silicon oxide, a nitride, the like, or a combination thereof. The dielectric material may be formed, after an optional cleaning and lining of the first trenches 103, using either a high density plasma chemical vapor deposition (HDP-CVD), a flowable CVD (FCVD) (e.g., a CVD-based material deposition in a remote plasma system and post curing to convert it to another material, such as an oxide), the like, or a combination thereof. In some embodiments, an anneal process may be performed once the dielectric material is formed. In an embodiment, the dielectric material is formed such that excess dielectric material covers the fins 107. Although the dielectric material is illustrated as a single layer, some embodiments may utilize multiple layers. For example, in some embodiments one or more liners (not shown) may first be formed along a surface of the substrate 101 and the fins 107. Thereafter, a fill material, such as those discussed above may be formed over the one or more liners.

A removal process is then applied to the dielectric material to remove excess dielectric material over the fins 107. In some embodiments, a planarization process such as a chemical mechanical polish (CMP), an etch-back process, combinations thereof, or the like may be utilized. The planarization process exposes the fins 107 such that top surfaces of the fins 107 and the dielectric material are level after the planarization process is complete. In embodiments in which a mask remains on the fins 107, the planarization process may expose the mask or remove the mask such that top surfaces of the mask or the fins 107, respectively, and the dielectric material are level after the planarization process is complete.

The dielectric material is then recessed to form the STI regions 105. The dielectric material is recessed such that upper portions of the fins 107 protrude from between neighboring STI regions 105. Further, the top surfaces of the STI regions 105 may have a flat surface as illustrated, a convex surface, a concave surface (such as dishing), or a combination thereof. The top surfaces of the STI regions 105 may be formed flat, convex, and/or concave by an appropriate etch. The STI regions 105 may be recessed using an acceptable etching process, such as one that is selective to the dielectric material of the STI regions 105 (e.g., etches the dielectric material of the STI regions 105 at a faster rate than the material of the fins 107). For example, an oxide removal using, for example, dilute hydrofluoric (dHF) acid may be used. However, other etchants, such as $H_2$, and other methods, such as a RIE, a dry etch with etchants such as $NH_3/NF_3$, chemical oxide removal, or dry chemical clean may be used.

However, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the STI regions 105 have been formed, a dummy gate dielectric 109, a dummy gate electrode 111 over the dummy gate dielectric 109, and first spacers 113 may be formed over each of the fins 107. In some embodiments, the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide, silicon oxynitride, silicon nitride, combinations thereof, or the like. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof. Additionally, any combination of silicon dioxide, silicon oxynitride, and/or high-k materials may also be used for the dummy gate dielectric 109.

The dummy gate electrode 111 may comprise a conductive or non-conductive material and may be selected from a group comprising amorphous silicon, polycrystalline-silicon (polysilicon), polycrystalline silicon-germanium (poly-SiGe), metallic nitrides (e.g., TiAlN, TaCN, TaSiN, TiN, TaN), metallic silicides, metallic oxides, metallic carbides (e.g., TaC), metals or alloys, including W, Al, Cu, AlCu, W, Ti, Mn, Zr, Ta, Co, Ni, combinations of these, or the like. The dummy gate electrode 111 may be deposited by chemical vapor deposition (CVD), sputter deposition, PVD, or other techniques known and used in the art for depositing the listed materials. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) one or more layers of silicon oxide, silicon oxynitride, SiCON, SiC, SiOC, silicon nitride, and/or any combinations thereof. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not specifically illustrated in FIG. 1) on the previously formed structure. The spacer layer may comprise silicon oxide, silicon nitride, silicon oxynitride, silicon carbonitride, silicon oxycarbide, other oxides, nitrides or oxynitrides, a combination thereof, or the like and may be formed by methods utilized to form such a layer, such as CVD, plasma enhanced CVD, sputter, and other methods known in the art. The spacer layer may comprise a different material with different etch characteristics or the same material as the dielectric material within the STI regions 105. The first spacers 113 may then be patterned, such as by one or more etches to remove the spacer layer from the horizontal surfaces of the structure, to form the first spacers 113.

Figure 2:
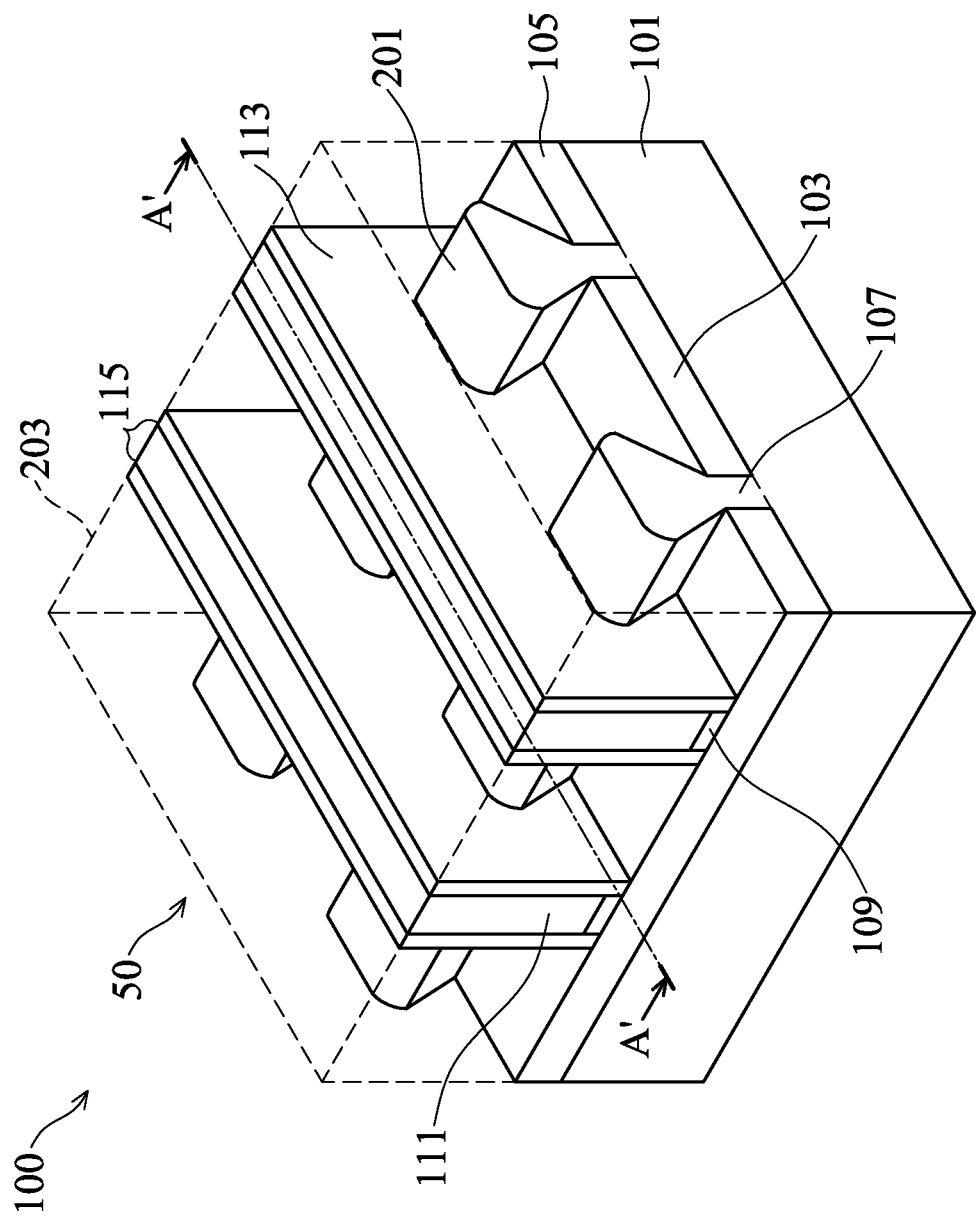

FIG. 2 illustrates a removal of the fins 107 from those areas not protected by the stacks 115 and the first spacers 113 and a regrowth of source/drain regions 201. The removal of the fins 107 from those areas not protected by the stacks 115 and the first spacers 113 may be performed by an RIE using the stacks 115 and the first spacers 113 as hardmasks, or by any other suitable removal process. The removal may be continued until the fins 107 are either planar with (as illustrated) or below the surface of the STI regions 105.

A hardmask (not specifically illustrated) may be placed and patterned to cover the dummy gate electrode 111 to prevent growth, and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. For regions in which the fins 107 comprise silicon and the FinFET is an n-type device, the source/drain regions 201 may be regrown through a selective epitaxial process with a material, such as silicon, silicon carbide, phosphorous-doped silicon carbide, silicon phosphide, which may have a same or different lattice constant as compared to the channel regions. For regions in which the fins 107 comprise silicon and the FinFET is a p-type device, the source/drain regions 201 may be regrown through a selective epitaxial process with a material, such as silicon, silicon germanium, boron-doped silicon germanium, germanium, germanium tin, which may have a same or different lattice constant as compared to the channel regions. The hardmask may be formed to cover regions with p-type devices while forming the source/drain regions 201 for the n-type devices. The hardmask or portions of the hardmask may be removed, and another hardmask may be formed to cover regions with n-type devices while forming the source/drain regions 201 for the p-type devices. These steps may be performed in the opposite order.

Source/drain regions 201 may be formed, and dopants may be implanted into the source/drain regions 201 by implanting appropriate dopants to complement the dopants in the fins 107. For example, p-type dopants such as boron, gallium, indium, or the like may be implanted to form a PMOS device. In other embodiments, n-type dopants such as phosphorous, arsenic, antimony, or the like may be implanted to form an NMOS device. These dopants may be implanted using the stacks 115 and the first spacers 113 as masks. It should be noted that many other processes, steps, or the like may be used to implant the dopants. For example, a plurality of implants may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point, the hardmask that covered the dummy gate electrode 111 and either of the regions for the p-type or n-type devices during the formation of the source/drain regions 201 is removed. In some embodiments, any of these hardmasks may be removed using, for example, a wet or dry etching process that is selective to the material of the hardmask. However, any suitable removal process may be utilized.

FIG. 2 also illustrates formation of a first inter-layer dielectric (ILD) layer 203 (illustrated in dashed lines in FIG. 2 in order to more clearly illustrate the underlying structures) over the stacks 115 and the source/drain regions 201. The first ILD layer 203 may comprise a material such as boron-doped phosphor-silicate glass (BPSG), boro-silicate glass (BSG), phospho-silicate glass (PSG), undoped silicate glass (USG), or any suitable dielectrics. The first ILD layer 203 may be formed using a process such as CVD, PECVD, FCVD, LPCVD, or any suitable process. The first ILD layer 203 may be planarized with the first spacers 113 using, for example, a planarization process such as a CMP process, although any suitable process may be utilized.

Figure 3:
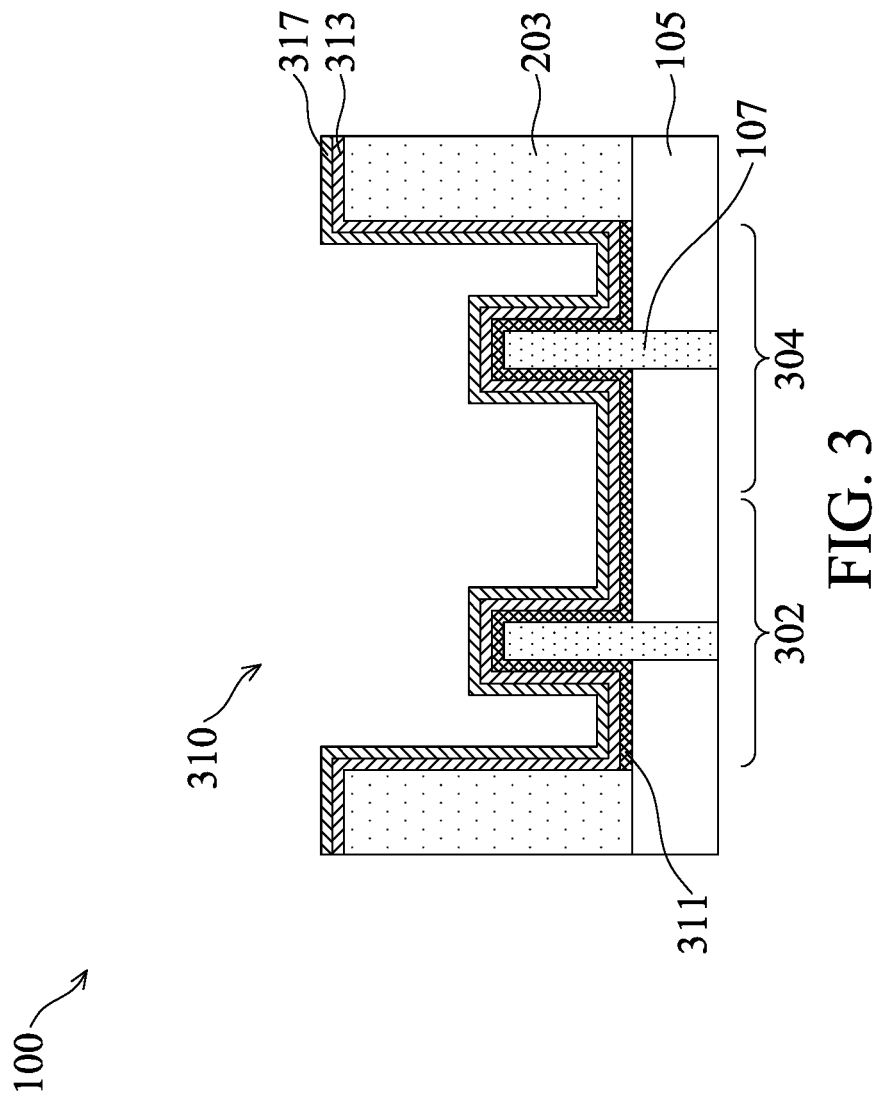
FIGS. 3-5 illustrate intermediate steps in the formation of features of a semiconductor device, in accordance with some embodiments.

FIG. 3 illustrates a cross-sectional view of FIG. 2 along line A-A' in order to better illustrate a removal of the material of the dummy gate electrode 111 and the dummy gate dielectric 109 and replacement with a plurality of layers for a first gate stack 1603 (illustrated at intermediate steps and completed in FIG. 16) in a first region 302 of the substrate 101 and a second gate stack 1604 (illustrated at intermediate steps and completed in FIG. 16) in a second region 304 of the substrate 101. Note that for the sake of simplicity the substrate 101 is not illustrated in FIG. 3 and onward because the subsequent features are formed over the fins 107 and the STI regions 105. In addition, FIG. 3 illustrates an extension of line A-A' to further include the first ILD layer 203. In an embodiment the first gate stack 1603 in the first region 302 may be a gate stack for, for example, an NMOS FinFET transistor, while the second gate stack 1604 in the second region 304 may be a gate stack for a PMOS FinFET transistor. However, any suitable devices may be utilized. Although FIG. 3 and onward depict the region 302 and the region 304 as being formed with continuous layers, it should be noted that the region 302 and the region 304 may be distinct and separated from one another.

In some embodiments, the dummy gate electrode 111 and the dummy gate dielectric 109 may be removed to form openings 310 using, for example, one or more wet or dry etching processes that utilize etchants that are selective to the material of the dummy gate electrode 111 and the dummy gate dielectric 109. However, any suitable removal process or processes may be utilized. Removal of the dummy gate electrode 111 and the dummy gate dielectric 109 results in the openings 310 in each of the regions (e.g., the first region 302 and the second region 304).

Once the dummy gate electrode 111 and the dummy gate dielectric 109 have been removed, a process to form the gate stacks (e.g., the first gate stack 1603 and the second gate stack 1604) in the first region 302, the second region 304, and any other regions may be begun by depositing a series of layers into the openings 310. In an embodiment, the series of layers may include an interfacial layer 311, a first dielectric material 313, a first p-metal work function layer 317, and a fill material 1601 (see FIG. 16), although more layers may be included as noted later. The series of layers are deposited such that the openings 310 become only partially filled.

Optionally, the interfacial layer 311 may be formed prior to the formation of the first dielectric material 313. In an embodiment the interfacial layer 311 may be a material such as silicon dioxide formed by a thermal or chemical oxidation, such as through in situ steam generation (ISSG). In another embodiment the interfacial layer 311 may be a high-k material such as $HfO_2$, HfSiO, HfSiON, HfTaO, HfTiO, HfZrO, LaO, ZrO, $Ta_2O_5$, combinations of these, or the like, although any suitable material or process of formation may be utilized.

The first dielectric material 313 may be formed in the openings 310 and, in embodiments with the interfacial layer 311, formed as a capping layer over the interfacial layer 311. In some embodiments, the first dielectric material 313 is a high-k material such as a metal oxide or a silicate of hafnium, aluminum, zirconium, lanthanum, manganese, barium, titanium, lead, and combinations thereof, deposited through a process such as Molecular-Beam Deposition (MBD), atomic layer deposition (ALD), CVD, PECVD, or the like, although any suitable material and deposition process may be utilized.

Optionally, a first metal material (not specifically illustrated) may be formed adjacent to the first dielectric material 313 as, for example, a barrier layer and may be formed from a metallic material such as TaN, Ti, TiAlN, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material may be deposited using a deposition process such as ALD, CVD, sputtering, or the like, although any suitable material and deposition process may be used.

The first p-metal work function layer 317 may be formed over the first dielectric material 313 and over the first metal material if included. In some embodiments, the first p-metal work function layer 317 may be similar to the first metal material as described above. For example, the first p-metal work function layer 317 may be formed from a metallic material such as TiN, Ti, TiAlN, TaC, TaCN, TaSiN, TaSi$_2$, NiSi$_2$, Mn, Zr, ZrSi$_2$, TaN, Ru, Al, Mo, MoSi$_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the first p-metal work function layer 317 may be deposited using a deposition process such as ALD, CVD, sputtering, or the like, although any suitable material and deposition process may be used.

Notably, not all of the gate stacks, when completed, will include the first p-metal work function layer 317. For example, in some embodiments (e.g., when the first gate stack 1603 is an NMOS FinFET transistor), the first p-metal work function layer 317 may need to be removed from the first region 302. As shown in the subsequent paragraphs and figures, a series of layers may be formed over gate stacks in both of the first region 302 and the second region 304 (including the gate stacks in some other regions) in order to pattern the first p-metal work function layer 317 and remove it from the first gate stack 1603 in the first region 302 (and any of those other regions).

To remove the first p-metal work function layer 317, a series of layers, such as layers, including a photoresist, are formed over the wafer 100, including over the first region 302 and the second region 304. As discussed in more detail below, a bottom anti-reflective coating (BARC) layer 401 (see FIG. 4) is formed over the first p-metal work function layer 317, a hardmask layer 501 (see FIG. 5) is formed over the BARC layer 401, an anti-reflective coating (ARC) layer 1001 (see FIG. 10) is formed over the hardmask layer 501, and a photoresist layer 1003 (see FIG. 10) is formed over the ARC layer 1001.

Figure 4:
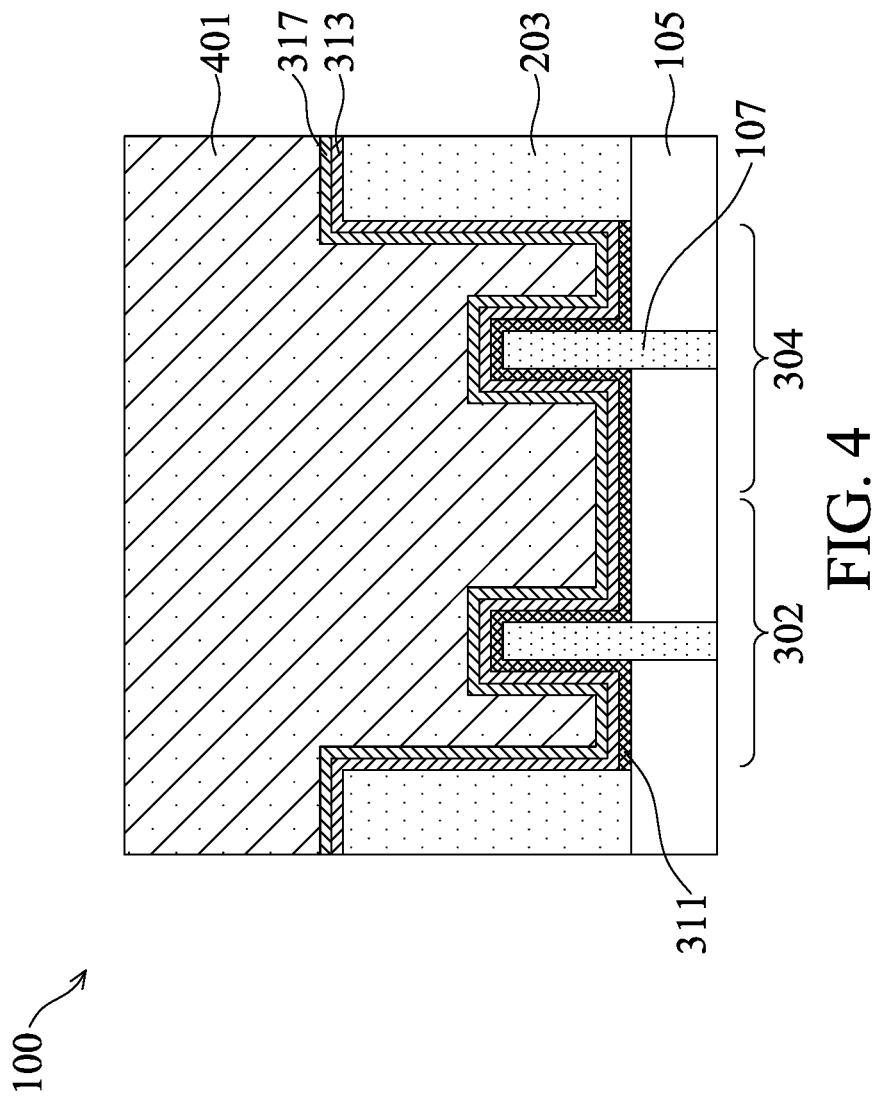

FIG. 4 illustrates forming a BARC layer 401 into and over the openings 310 in each of the regions (e.g., the first region 302 and the second region 304). Deposition of the BARC layer 401 serves as an initial step in the removal of the first p-metal work function layer 317 from the first region 302 but not from the second region 304. The BARC layer 401 is applied in preparation for an application of the overlying layers that also facilitate patterning of the underlying first p-metal work function layer 317. The BARC layer 401, as its name suggests, works to prevent the uncontrolled and undesired reflection of energy (e.g., light) back into the overlying photoresist layer 1003 during an exposure of the photoresist layer 1003, thereby preventing the reflecting light from causing reactions in an undesired region of the photoresist layer 1003. Additionally, the BARC layer 401 may be used to provide a planar surface, helping to reduce the negative effects of the energy impinging at an angle. The BARC layer 401 may be an organic material coated over the wafer 100. In some embodiments, the organic material is polymerized after being coated over the wafer 100. A removal process is then applied to the BARC layer 401 to give the BARC layer 401 a smooth top surface. In some embodiments, a planarization process such as a chemical mechanical polish (CMP), an etch-back process, combinations thereof, or the like may be utilized. A cleaning process may be performed after the planarization process (e.g., CMP). The cleaning process may comprise washing the top surface of the BARC layer 401 with water, ammonium peroxide, hydrogen peroxide, the like, or combinations thereof. In accordance with some embodiments, the BARC layer comprises an oxide having some number of hydroxyl groups extending from the top surface of the BARC layer 401, and the cleaning process may form additional hydroxyl groups extending from the top surface.

Figure 5:
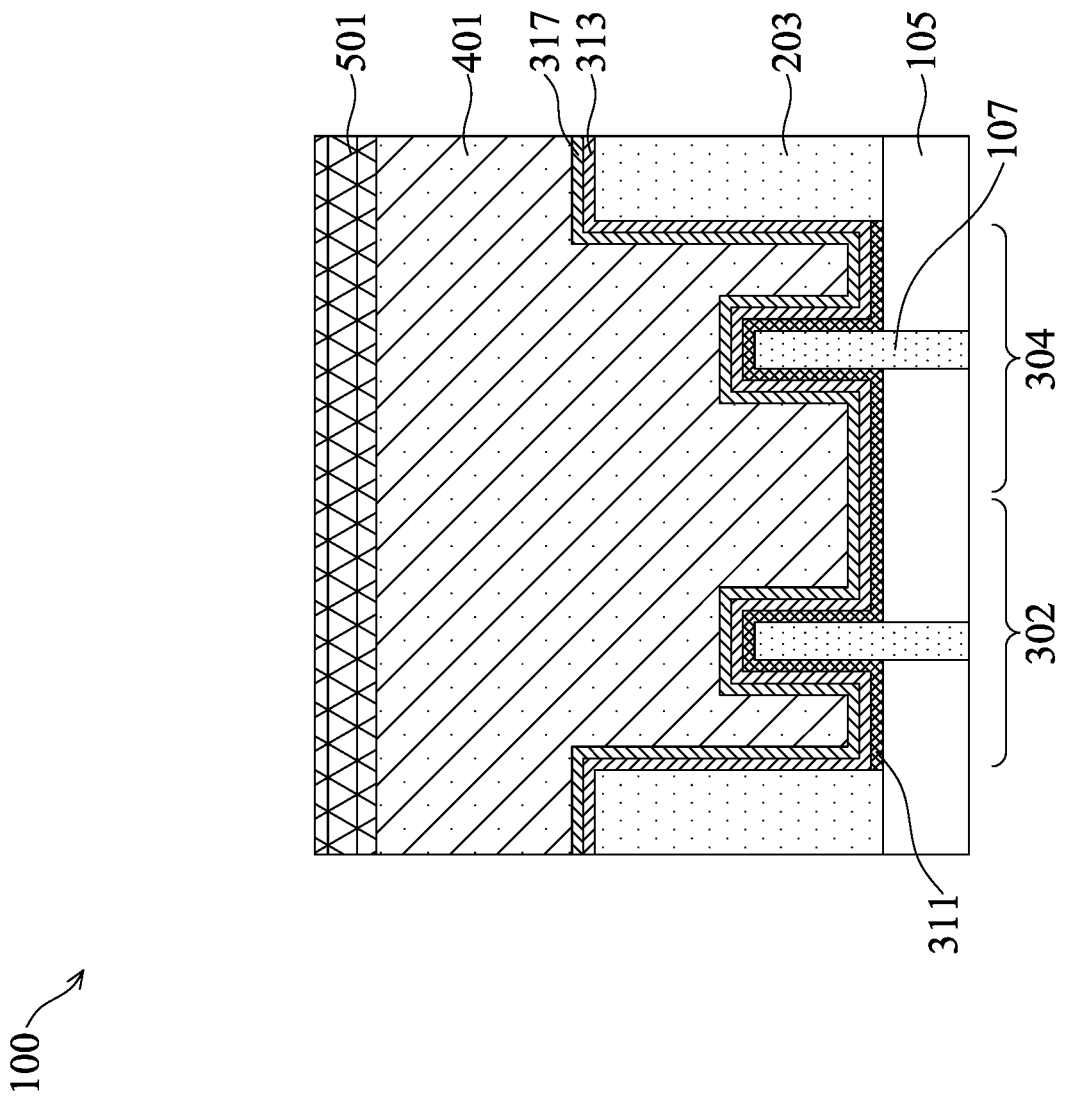

FIG. 5 illustrates forming a hardmask layer 501 over the BARC layer 401. The hardmask layer 501 may comprise aluminum oxide, aluminum, titanium, titanium nitride, silicon, silicon nitride, silicon oxynitride, other oxides, the like, or combinations thereof. The hardmask layer 501 may be formed through a process such as ALD, CVD, PECVD, low pressure chemical vapor deposition (LPCVD), or the like.

In accordance with some embodiments, the hardmask layer 501 is an oxide, such as aluminum oxide (Al$_2$O$_3$), and formed by an ALD process. The ALD process comprises alternating pulses (or sub-cycles) of flowing an aluminum precursor and flowing an oxygen precursor with purges of those substances in between. Each purge may include flowing nitrogen gas (N$_2$) and/or argon (Ar) to facilitate removal of the precursor and volatile products from the most recent pulse. In some embodiments, the aluminum precursor may comprise trimethylaluminum (TMA) in the form of Al(CH$_3$)$_3$, and the oxygen precursor may comprise water (H$_2$O).

In cases in which the ALD includes two precursors, one full cycle may include flowing one precursor, purging the environment (e.g., with N$_2$ gas), flowing the other precursor, and purging the environment (e.g., with N$_2$ gas). As such, a pulse or sub-cycle would include the flowing of only one of the precursors. Formation of an exemplary aluminum oxide layer as the hardmask layer 501 will be discussed in further detail below.

Figure 6:
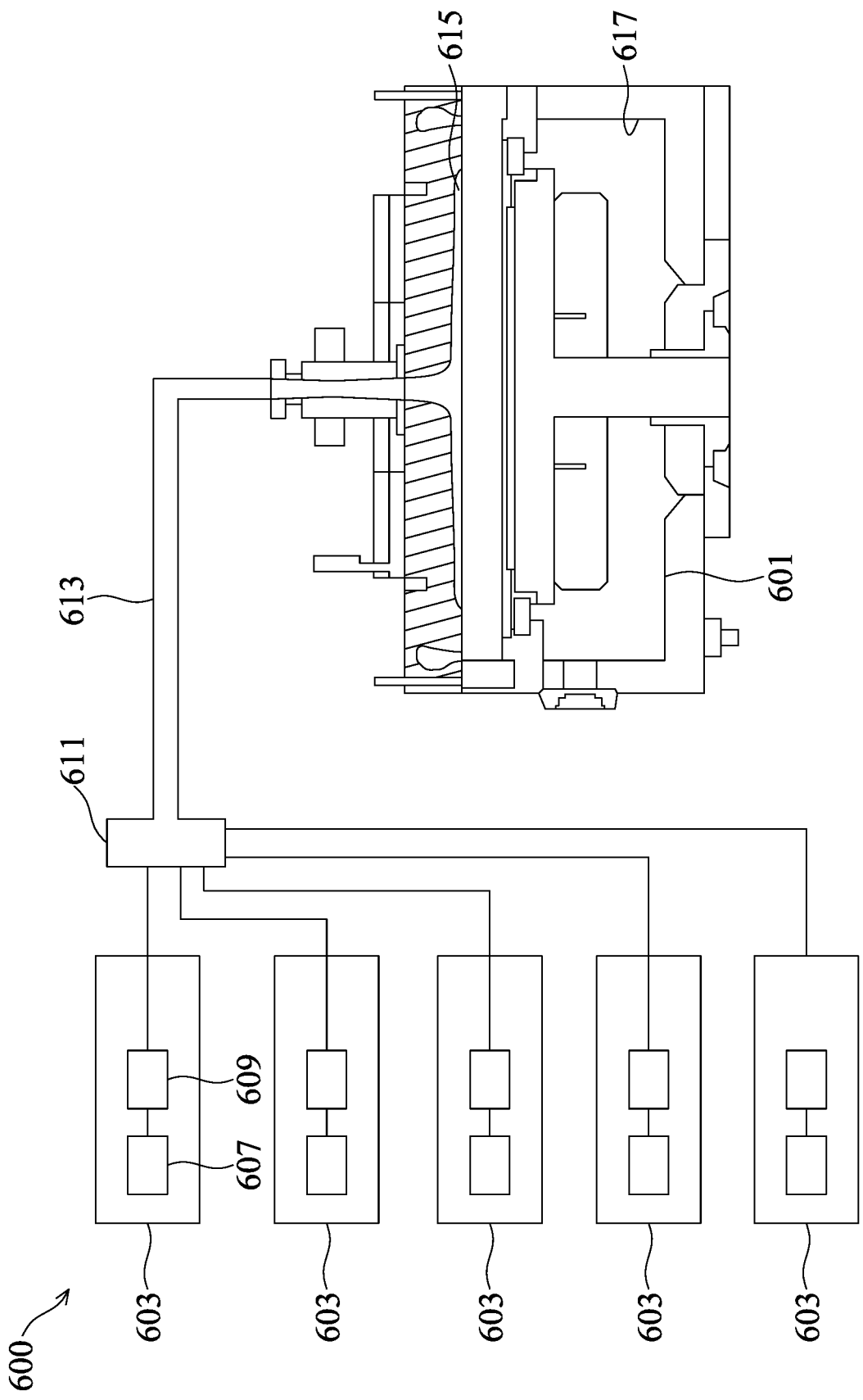
FIGS. 6-9 illustrate schematics of an atomic layer deposition (ALD) tool and preparation measures for the ALD tool, in accordance with some embodiments.

FIG. 6 illustrates an ALD system 600 that may be utilized to receive precursor materials from a plurality of precursor delivery systems 603 to form the hardmask layer 501 within a deposition chamber 601, in accordance with some embodiments. Although five precursor delivery systems 603 are illustrated, the ALD system 600 may include any number connected to the deposition chamber 601. The various precursor delivery systems may function in various combinations to supply the various different precursor materials to the deposition chamber 601. The ALD system 600 may be used to form an oxide, such as a metal oxide like aluminum oxide. As such, the ALD system 600 may be used to form the hardmask layer 501 comprising aluminum oxide.

For example, each precursor delivery system 603 may each include a gas supply 607 and a flow controller 609 (labeled for one of the precursor delivery systems 603 but, for simplicity, not labeled on the other precursor delivery systems 603). In some embodiments in which the precursor of one of the precursor delivery systems 603 is stored in a gaseous state, the gas supply 607 may supply a precursor to the deposition chamber 601. The gas supply 607 may be a vessel, such as a gas storage tank, that is located either locally to the deposition chamber 601 or else may be located remotely from the deposition chamber 601. In another embodiment, the gas supply 607 may be a facility that independently prepares and delivers its corresponding precursor to the flow controller 609. Any suitable source for the precursor may be utilized as the gas supply 607, and all such sources are fully intended to be included within the scope of the embodiments.

The gas supply 607 may supply the desired precursor to the flow controller 609. The flow controller 609 may be utilized to control the flow of the precursor to the precursor gas controller 611 and, eventually, to the deposition chamber 601, thereby also helping to control the pressure within the deposition chamber 601. The flow controller 609 may be, for example, a proportional valve, a modulating valve, a needle valve, a pressure regulator, a mass flow controller, combinations of these, or the like. However, any suitable method for controlling and regulating the flow of the precursor may be utilized, and all such components and methods are fully intended to be included within the scope of the embodiments.

While the precursor delivery systems 603 have been described herein as having identical components, this is merely an illustrative example and is not intended to limit the embodiments in any fashion. Any type of suitable precursor delivery system 603, with any type and number of individual components identical to or different from any of the other precursor delivery systems 603 within the ALD system 600, may alternatively be utilized. All such precursor delivery systems 603 are fully intended to be included within the scope of the embodiments.

Each of the precursor delivery systems 603 may supply their individual precursors into the precursor gas controller 611. The precursor gas controller 611 connects and isolates the precursor delivery systems 603 from the deposition chamber 601 in order to deliver the desired precursors to the deposition chamber 601 at the desired times. The precursor gas controller 611 may include such devices as valves, flow meters, sensors, and the like to control the delivery rates of each of the precursors, and may be controlled by instructions received from a control unit (not specifically illustrated).

The precursor gas controller 611, upon receiving instructions from the control unit, may open and close valves so as to connect one or more of the precursor delivery systems 603 to the deposition chamber 601 and direct a desired precursor through a manifold 613, into the deposition chamber 601, and to a showerhead 615. The showerhead 615 may be utilized to disperse the chosen precursor(s) into the deposition chamber 601 and may be designed to evenly disperse the precursor in order to minimize undesired process conditions that may arise from uneven dispersal. In some embodiments, the showerhead 615 may have a circular design with openings (illustrated in later figures) distributed around the showerhead 615 to allow for the dispersal of the desired precursor into the deposition chamber 601. Each of the openings of the showerhead 615 may have a diameter of between about 0.5 mm and about 1 mm, such as about 1 mm.

The deposition chamber 601 has an inner sidewall 617. The deposition chamber 601 may have a cylindrical shape such that the inner sidewall 617 comprises a portion that is curved, or the inner sidewall 617 may have any other suitable shape, such as a hollow square tube, a hexagonal shape, an octagonal shape, or the like. Furthermore, the inner sidewall 617 may be made of material that is inert to some or all of the various precursors and processes. In some embodiments, the inner sidewall 617 may have a low level of reactivity with one or more of the various precursors and processes. However, even a very low level of reactivity may have compounding effects over the course of many deposition cycles. The inner sidewall 617 may be any suitable material that can withstand the chemistries and pressures involved in the deposition process, such as aluminum, steel, stainless steel, nickel, alloys of these, combinations of these, and like. The showerhead 615 may comprise any of these materials as well.

Still referring to FIG. 6, the deposition chamber 601 additionally includes other components that may not be discussed or referenced in detail herein. For example, some other components of the deposition chamber 601 include viewing ports, lift pins and lift pin pads, spacer plates and seal rings, wafer heater and heating elements, and cooling plates and cooling elements. The deposition chamber 601 may include other features that may or may not be specifically illustrated.

Briefly referring to the formation of the hardmask layer 501, the hardmask layer 501 may be formed in this example of a metal oxide, such as aluminum oxide, using precursors of TMA and water in alternating pulses in an ALD process at a temperature between about room temperature (e.g., about 25° C.) and about 300° C., or about 150° C. and about 300° C.

However, if the deposition chamber 601 is left untreated, then small amounts of water may deposit onto the inner sidewall 617 and/or the showerhead 615, for example, when the inner sidewall 617 and/or the showerhead 615 comprises aluminum (for simplicity, at times the inner sidewall 617 may be referenced to include both the inner sidewall 617 and the showerhead 615). In some cases, water molecules may adsorb onto the inner sidewall 617 and expel a hydrogen atom. In particular, two hydrogen atoms may bond to form $H_2$ gas, while hydroxyl groups (—OH) bond to and remain on the aluminum inner sidewall 617. Those hydroxyl groups may then serve as undesired reactive sites for TMA to react and bond with during the next TMA pulse. The resulting products (e.g., portions of the TMA precursor bonded to the inner sidewall 617) then become reactive sites for water to react and bond with during the next water pulse. Repeated cycles will cause aluminum oxide to build up along the inner sidewall 617 and/or the openings of the showerhead 615. Indeed, varying degrees of the buildup may occur for other materials for the inner sidewall 617 and the showerhead 615, including those listed above. As discussed below, before the formation of the hardmask layer 501, certain preparation steps may be performed on the deposition chamber 601 to prevent or reduce undesired depositions during the formation of the hardmask layer 501.

Figure 7:
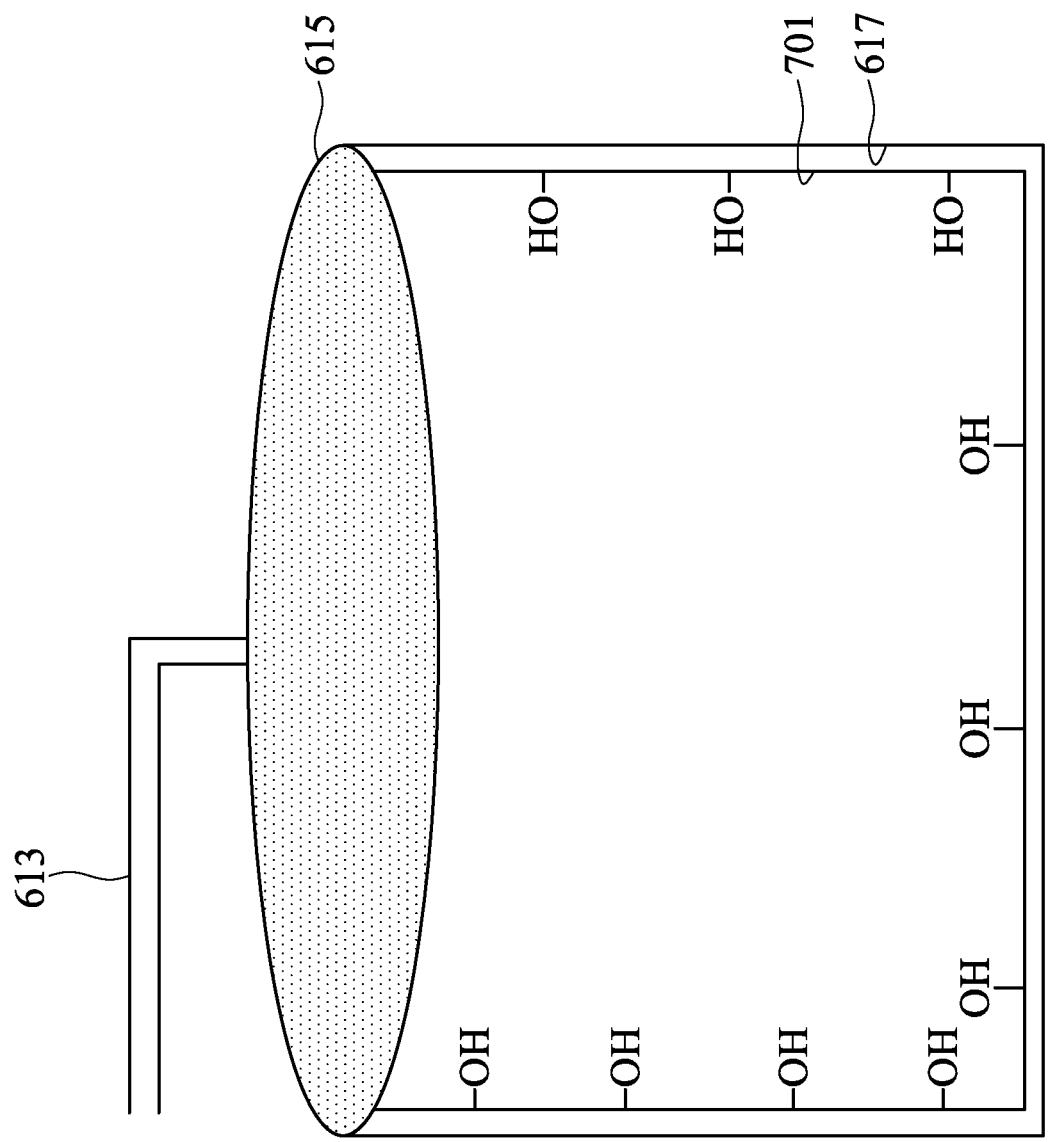
Figure 8:
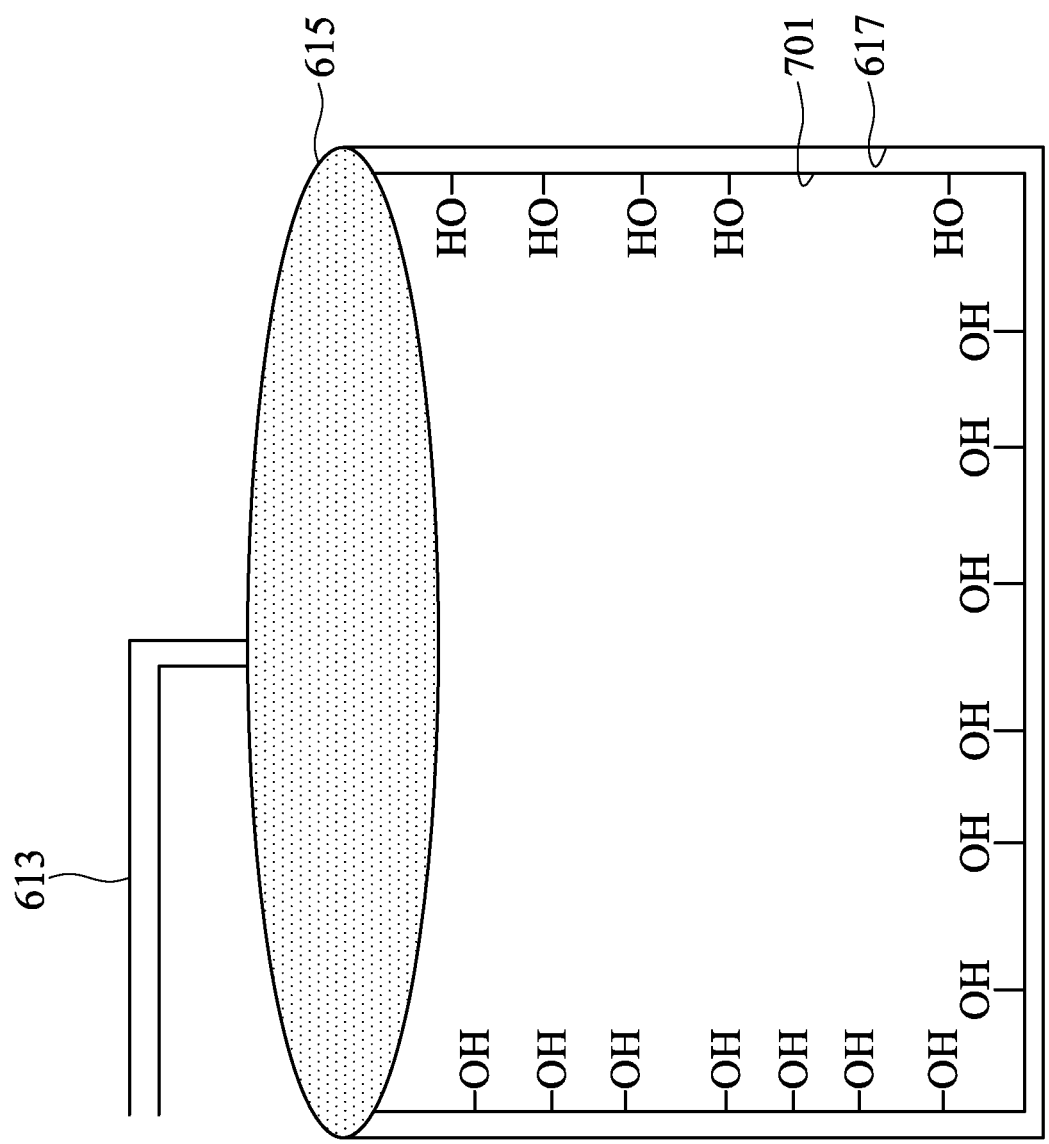
Figure 9:
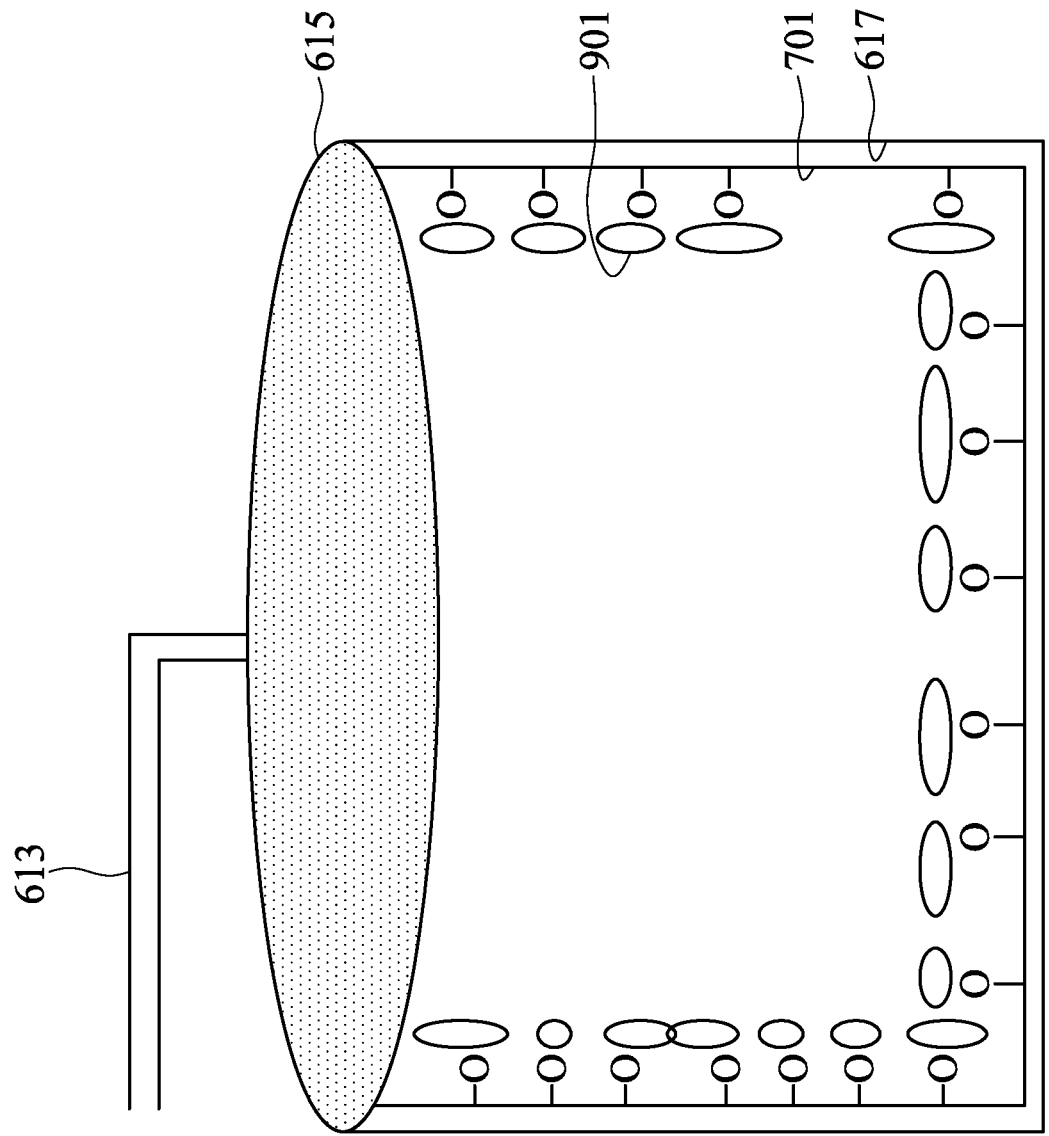

FIGS. 7-9 illustrate close-up and simplified schematics of the deposition chamber 601. Note that most of the components identified above are not illustrated for the purpose of emphasizing the showerhead 615 and the inner sidewall 617.

FIGS. 7 and 8 illustrate the formation of a protective coat 701 over the showerhead 615, within the openings of the showerhead 615, and over the inner sidewall 617 as first steps in the preparation of the deposition chamber 601. Note that for simplicity, the protective coat 701 is only illustrated over the inner sidewall 617, although the protective coat 701 may also form over and within openings in the showerhead 615. In addition, while the inner sidewall 617 and the showerhead 615 are more specifically discussed herein, the following preparation steps may also apply treatments over the sidewalls of other features of the ALD system 600, such as portions of the manifold 613, which may include a fore line, a pumping line, and a pump. The protective coat 701 is formed before the wafer 100 is placed inside the deposition chamber 601 for processing and helps prevent or reduce the buildup of, for example, aluminum oxide during subsequent ALD processes. A treatment process may be performed to form the protective coat 701 over the inner sidewall 617 and within the openings of the showerhead 615.

The protective coat 701 may be formed by CVD, ALD, PECVD or any suitable process by simultaneously flowing one or more precursors from the precursor delivery systems through the showerhead 615 and onto the inner sidewall 617. The one or more precursors react with one another and the material of the showerhead 615 and the inner sidewall 617 to deposit the protective coat 701.

For example, the protective coat 701 may comprise a silicon oxide layer over the showerhead 615 and the inner sidewall 617. As such, the silicon oxide of the protective coat 701 may be formed by flowing a silicon precursor and an oxygen precursor. In some embodiments, the silicon precursor may comprise tetraethoxysilane ($Si(OC_2H_5)_4$) (TEOS), $Si(C_2H_5)_2H_2$, $SiH_4$, or the like. However, any suitable silicon precursors may be utilized.

Additionally, the oxygen precursor may be chosen to react with the silicon precursor to form the desired material (e.g., silicon oxide). As such, while the precise precursor chosen may depend at least in part on the silicon precursor that has been chosen, in embodiments in which the silicon precursor comprises tetraethoxysilane or TEOS, the oxygen precursor may comprise ozone ($O_3$), $N_2O$ plasma, $O_2$ plasma, the like, any suitable material, or any combination thereof. However, any suitable precursor may be utilized for the oxygen precursor.

Additionally, while precursors have been described with respect to the formation of the protective coat 701 when the protective coat 701 comprises silicon oxide, this precise embodiment is intended to be illustrative and is not intended to be limiting. Rather, any suitable combination of precursors may be utilized to form the protective coat 701 when the precise material of the protective coat 701 has been chosen. All such combinations are fully intended to be included within the scope of the embodiments.

In some embodiments in which the protective coat 701 is silicon oxide, the silicon precursor and the oxygen precursor may be flowed simultaneously to react and form the protective coat 701 over the showerhead 615 and the inner sidewall 617. The silicon precursor may be flowed at a flowrate of between about 10 sccm and about 200 sccm, and the oxygen precursor may be flowed at a flowrate of between about 100 sccm (standard cubic centimeters per minute) and about 10 SLM (standard liters per minute). The process may be performed at temperatures between about 150° C. and about 400° C. and at pressures between about 1.5 Torr and about 10 Torr. However, any suitable parameters may be utilized.

The protective coat 701 may be formed at a thickness of between about 30 Å and about 1000 Å. Less than 30 Å may result in the protective coat 701 being too inconsistent to facilitate subsequent preparation steps, such as a hydrophobic treatment discussed below. Greater than 1000 Å may result in the protective coat 701 being too thick within the openings of the showerhead 615 and thereby cause obstructions in the flow of precursors through the showerhead 615 during later formation of the hardmask layer 501. Note that the illustrations in the figures are qualitative in nature and do not necessarily reflect relative sizes or dimensions.

As illustrated in FIG. 8, optionally, a treatment process may be performed on the protective coat 701. Notably, the protective coat 701 comprises hydroxyl groups (—OH) along exposed surfaces. The treatment process comprises flowing a precursor such as water from the precursor delivery system to adsorb and react with the protective coat 701 to increase the number and concentration of hydroxyl groups along the exposed surfaces. The treatment process may additionally or alternatively include other materials than water, such as hydrogen peroxide ($H_2O_2$), ammonium peroxide (($NH_4)_2O_2$), O2 plasma, the like, or any combination thereof.

The treatment process may be performed by flowing the one or more materials, such as water, at a flowrate of between about 5 sccm and about 100 sccm. The process may be performed at temperatures between about 150° C. and about 400° C. and at pressures between about 1.5 Torr and about 25 Torr. However, any suitable parameters may be utilized.

Before the treatment process, an exposed surface of the protective coat 701 may have a concentration of hydroxyl groups between about 0 nano-gram/cm$^2$ and about 10 nano-gram/cm$^2$. Following the treatment process, the exposed surface of the protective coat 701 may have a concentration of hydroxyl groups between about 50 nano-gram/cm$^2$ and about 70 nano-gram/cm$^2$. The number or concentration of hydroxyl groups on the exposed surface of the protective coat 701 may increase by between about 500% and about 700% due to the treatment process.

FIG. 9 illustrates a hydrophobic treatment process comprising the formation of a hydrophobic coat 901 over the protective coat 701 as additional steps in the preparation of the deposition chamber 601. The hydrophobic coat 901 helps to further prevent or reduce the buildup of, for example, aluminum oxide during the ALD process. A hydrophobic treatment process may be performed to form the hydrophobic coat 901 over and bonded to the protective coat 701 within the openings of the showerhead 615, over the showerhead 615, and over the inner sidewall 617. The hydrophobic treatment process is designed to attach portions of a hydrophobic precursor to the hydroxyl groups (e.g., formed in the initial formation of the protective coat 701 or, additionally, formed by the treatment process) extending from the protective coat 701. A benefit of performing the optional treatment process discussed in the preceding paragraph is to create enough exposed hydroxyl groups to form the hydrophobic coat 901 in a more robust and even layer.

The hydrophobic precursor may be flowed from the precursor delivery systems 603 into the deposition chamber 601 through the showerhead 615 to react with the exposed hydroxyl groups extending from the protective coat 701 thereby forming the hydrophobic coat 901. The hydrophobic precursor may comprise a hydrocarbon chlorosilane comprising an 8-10 carbon chain. For example, the hydrophobic precursor may be fluorinated, such as perfluorooctyltrichlorosilane ($CF_3(CF_2)_5CH_2CH_2SiCl_3$) (FOTS) and perfluorodecyltrichlorosilane ($CF_3(CF_2)_7CH_2CH_2SiCl_3$) (FDTS), or non-fluorinated, such as octyltrichlorosilane ($C_8H_{17}SiCl_3$) and decyltrichlorosilane ($C_{10}H_{21}SiCl_3$). In another embodiment, the hydrophobic precursor may be a hydrocarbon phosphonic acid comprising an 8-10 carbon chain, such as octylphosphonic acid ($CH_3(CH_2)_7PO(OH)_2$) and decylphosphonic acid ($CH_3(CH_2)_9PO(OH)_2$). A hydrophobic precursor having greater than 10 carbons in its chain may result in a hydrophobic coat 901 that exhibits Van der Waals forces to the extent that the resulting hydrophobic coat 901 may still attract the precursors for the ALD deposition (e.g., water and/or TMA) and thereby allow the undesired depositions onto the showerhead 615 and the inner sidewall 617 that the protective coat 701 and hydrophobic coat 901 are designed to reduce or prevent. In addition, a hydrophobic precursor having fewer than 8 carbons in its chain may not readily lay across the surface to robustly cover unreacted hydroxyl groups or chlorines, which may similarly attract the precursors for the ALD deposition. In other embodiments, the hydrophobic precursor may comprise longer carbon chains, such as octadecyltrichlorosilane ($CH_3(CH_2)_{17}SiCl_3$) (ODTS) octadecylphosphonic acid ($CH_3(CH_2)_{17}PO_3H_2$) (ODPA), the like, or any combination thereof.

Following formation of just the protective coat 701 (e.g., silicon oxide layer), droplets of water resting on the surface of the protective coat 701 would have a contact angle of between about 10 degrees and about 40 degrees. However, following formation of the hydrophobic coat 901, droplets of water resting on the surface of the hydrophobic coat 901 would have a contact angle of between about 100 degrees and about 120 degrees. The higher contact angles show that a precursor such as water is less likely to adsorb or bond to the surfaces of the protective coat 701 or the hydrophobic coat 901.

During formation of the hydrophobic coat 901, the hydrophobic precursor generally undergoes an exchange reaction with the exposed hydroxyl groups of the protective coat 701. For example, in the case of perfluorooctyltrichlorosilane, a chlorine atom may bond with a hydrogen atom from a hydroxyl group to form hydrogen chloride (HCl) gas. In addition, the silicon atom in the hydrophobic precursor bonds with the oxygen atom from the hydroxyl group. Similar reactions may occur with one or both of the other chlorine atoms in the hydrophobic precursor if there are other hydroxyl groups in adequate positions nearby.

In the case of the hydrophobic precursor being a phosphonic acid, a hydroxyl group from the hydrophobic precursor may bond with a hydrogen atom from an exposed hydroxyl group on the protective coat 701 to form water ($H_2O$) along with the hydrophobic coat 901. In addition, the phosphorus atom in the hydrophobic precursor bonds with the oxygen atom from the exposed hydroxyl group.

The hydrophobic treatment process may be performed by flowing the one or more precursors at a flowrate of between about 5 sccm and about 50 sccm. The process may be performed at temperatures between about 100° C. and about 300° C. and at pressures between about 1.5 Torr and about 25 Torr. However, any suitable parameters may be utilized.

In cases in which the protective coat 701 is formed without also performing the treatment process or the hydrophobic treatment process, the deposition chamber 601 may utilize cleaning, replacement, or other intensive product maintenance procedures after about 5,000 cycles to about 10,000 cycles of depositions (e.g., metal oxide depositions). As discussed above, a cycle may include one round of flowing each precursor, such as flowing one precursor, purging the deposition chamber 601, flowing another precursor, and purging the deposition chamber 601. In cases in which the treatment process and the hydrophobic treatment process are also performed, the deposition chamber 601 may utilize cleaning, replacement, or other intensive product maintenance procedures after about 20,000 cycles to about 50,000 cycles of depositions (e.g., metal oxide depositions).

Further, repeating the treatment process and the hydrophobic treatment process (that is, without repeating the process for forming the protective coat 701) may be performed between about every 10 cycles to about every 100 cycles of the ALD deposition. In another embodiment, the treatment process and the hydrophobic treatment process may be performed before each ALD process onto a wafer (e.g., wafer 100) or after about 1 ALD process to about 10 ALD processes.

Figure 10:
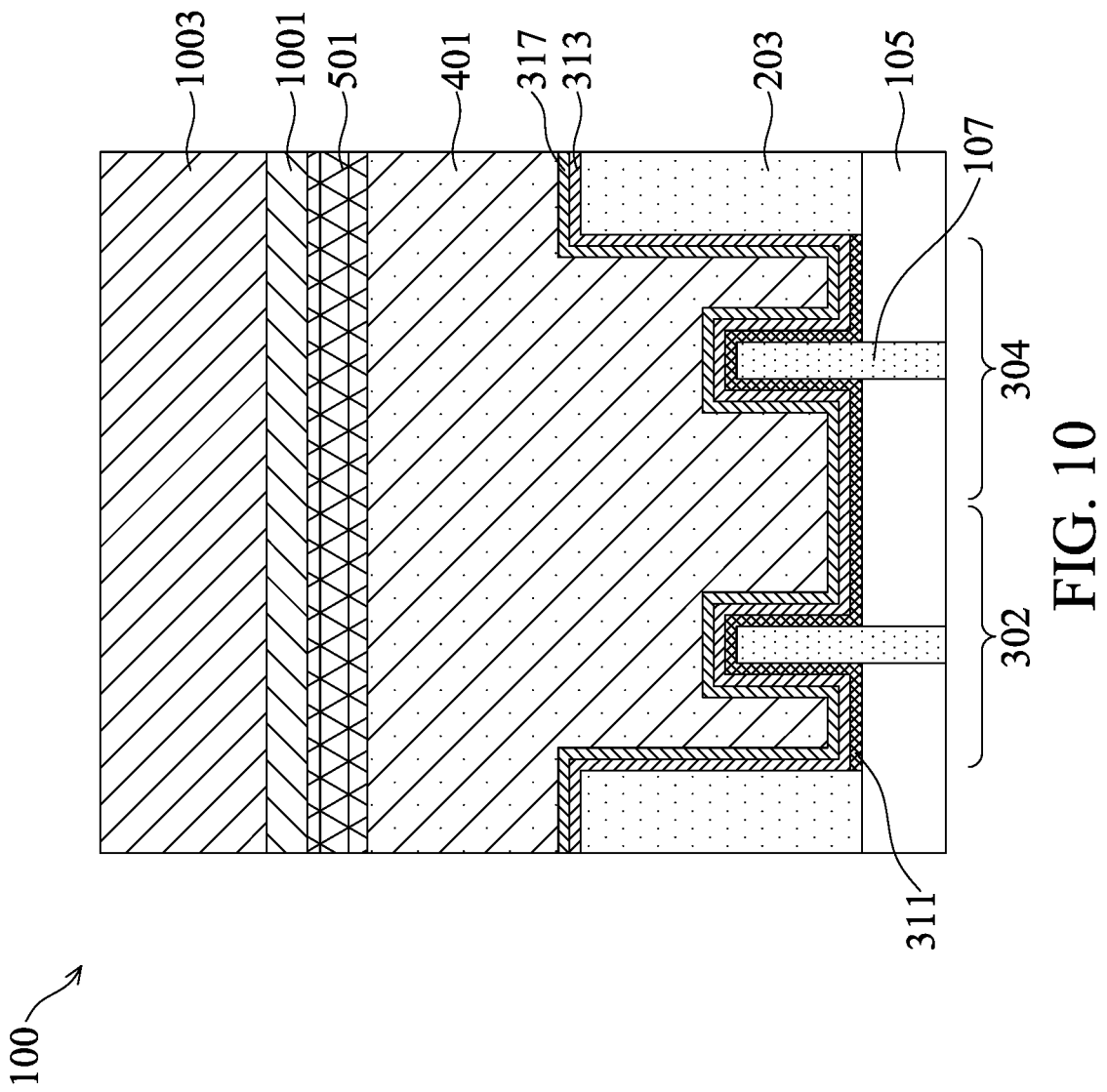
FIGS. 10-16 illustrate intermediate steps in the formation of features of a semiconductor device, in accordance with some embodiments.

Returning to the layers that facilitate the patterning of the p-metal work function layer 317, FIG. 10 illustrates forming an anti-reflective coating (ARC) layer 1001 over the hardmask layer 501. The ARC layer 1001, as its name suggests, has a different optical property than other layers used in the patterning, such as the subsequently formed photoresist layer 1003. The ARC layer 1001 works to prevent the uncontrolled and undesired reflection of energy such as light back into the overlying photoresist layer 1003 during an exposure of the photoresist layer 1003, thereby preventing the reflecting light from causing reactions in an undesired region of the photoresist layer 1003. For example, the ARC layer 1001 may have a different refractive index (n), a different extinction coefficient (k), or thickness (T) value than the photoresist layer 1003. Additionally, the ARC layer 1001 may be used to provide a planar surface, helping to reduce the negative effects of the energy impinging at an angle. The ARC layer 1001 may be applied using a process such as a spin-on coating process, a dip coating method, an air-knife coating method, a curtain coating method, a wire-bar coating method, a gravure coating method, a lamination method, an extrusion coating method, combinations of these, or the like.

FIG. 10 further illustrates forming a photoresist layer 1003 over the ARC layer 1001. The photoresist layer 1003 may include a polymer resin along with one or more photoactive compounds (PACs) and cross-linkers in a solvent. The polymer resin and the PACs within the solvent are applied over the ARC layer 1001, and a pre-exposure bake is performed in order to heat and drive off the solvent in order to remove the solvent and leave behind the polymer resin and the PACs for exposure.

Figure 11:
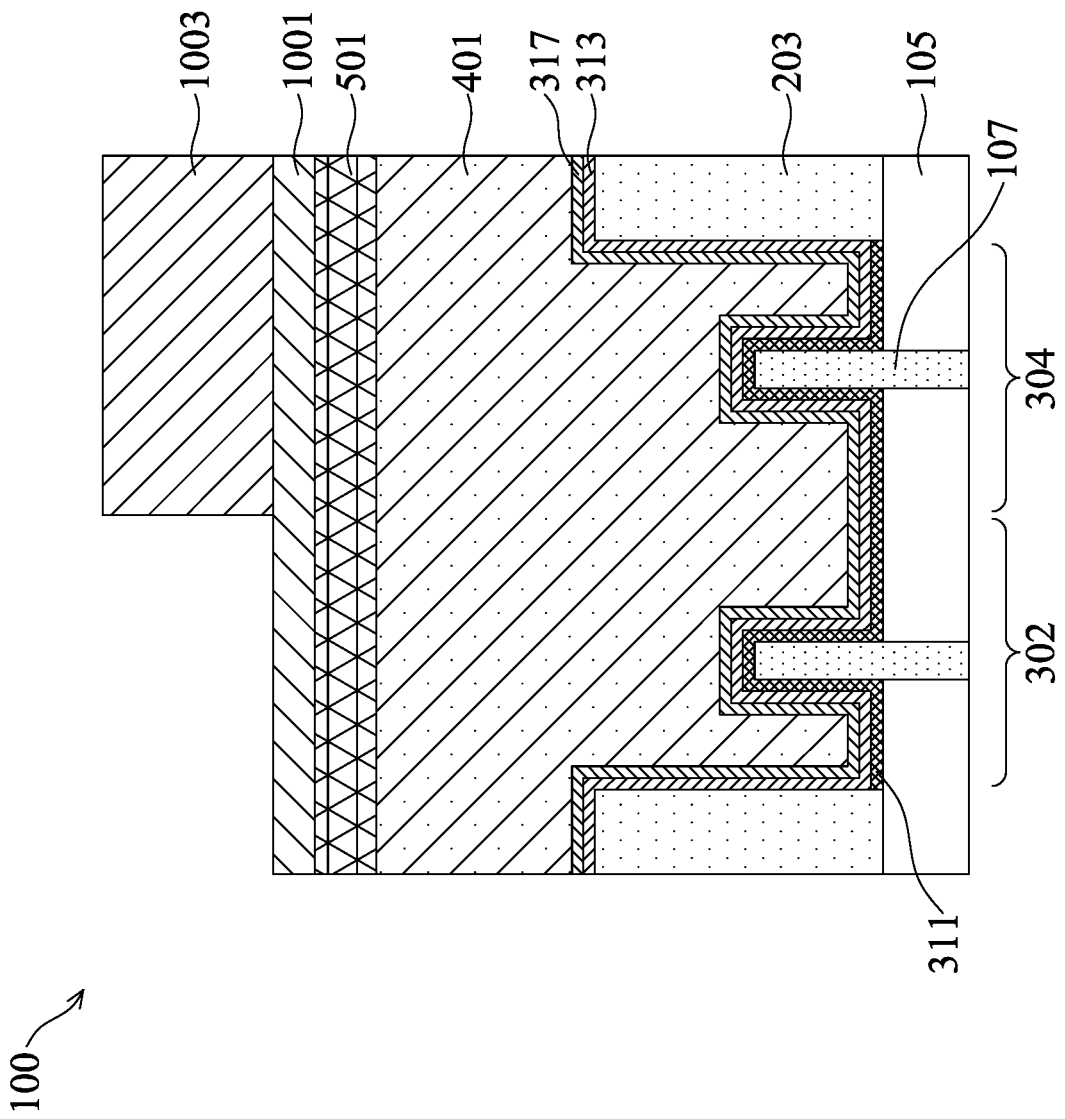

FIG. 11 illustrates patterning the photoresist layer 1003. The photoresist layer 1003 may be patterned by exposing photosensitive material (e.g., the PACs) within the photoresist layer 1003 to a patterned energy source (e.g., light) through, for example, a patterned mask or reticle (not specifically illustrated). The patterned mask or reticle may be placed over the photoresist layer 1003 to block the energy source from reaching certain portions of the photoresist layer 1003. The patterned mask is therefore located between the energy source and the photoresist layer 1003 in order to block portions of the energy from impinging upon the photoresist layer 1003. In some embodiments, the patterned mask may comprise a series of layers (e.g., substrate, absorbance layers, anti-reflective coating layers, shielding layers, etc.) to reflect, absorb, or otherwise block portions of the energy from reaching those portions of the photoresist layer 1003 which are not desired to be illuminated. The desired pattern may be formed in the patterned mask by forming openings through the patterned mask in the desired shape of illumination. The impact of the energy will cause a chemical reaction in those exposed parts of the photosensitive material in the photoresist layer 1003 that were impacted by the patterned energy source, thereby modifying the physical properties of the exposed portions of the photoresist layer 1003 such that the physical and/or chemical properties of those exposed portions of the photoresist layer 1003 are different from the physical and/or chemical properties of the unexposed portions of the photoresist layer 1003. The photoresist layer 1003 may then be developed with, for example, a developer (not specifically illustrated), in order to separate the exposed portion of the photoresist layer 1003 from the unexposed portion of the photoresist layer 1003. For example, the developer may dissolve the exposed portion of the photoresist layer 1003 to allow it to be removed, leaving the unexposed portion of the photoresist layer 1003 in place. In some embodiments, the developer and the developed portion of the photoresist layer 1003 may be removed using, for example, a spin-dry process, although any suitable removal technique may alternatively be utilized.

Figure 12:
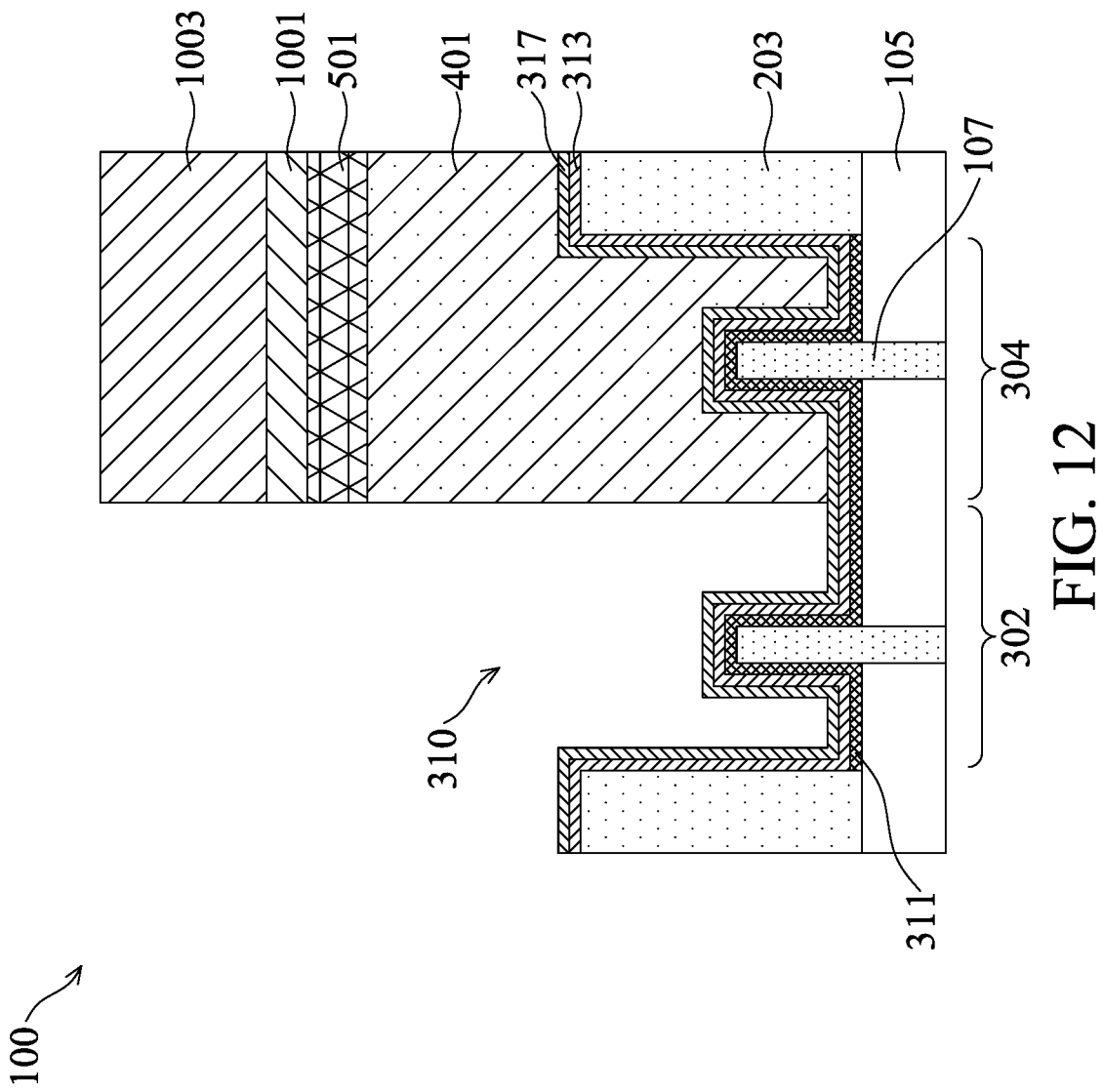

FIG. 12 illustrates transferring the pattern of the photoresist layer 1003 to the ARC layer 1001, the hardmask layer 501, and the BARC layer 401. The patterned photoresist layer 1003 may be used as a mask to pattern those underlying layers. For example, the pattern of the photoresist layer 1003 may be transferred to one or more of the underlying layers using an anisotropic etching process such as RIE, whereby ions of a suitable etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, decafluoromethane, trifluoromethane, tetrafluoromethane, perfluorocyclobutane, perfluoropropane, combinations of these, or the like may be utilized in a wet or dry etch to remove portions of those layers exposed by the patterned photoresist layer 1003. However, any other suitable etchants and any other suitable methods of removal, such as a wet stripping, may alternatively be used for one or more of the underlying layers.

Figure 13:
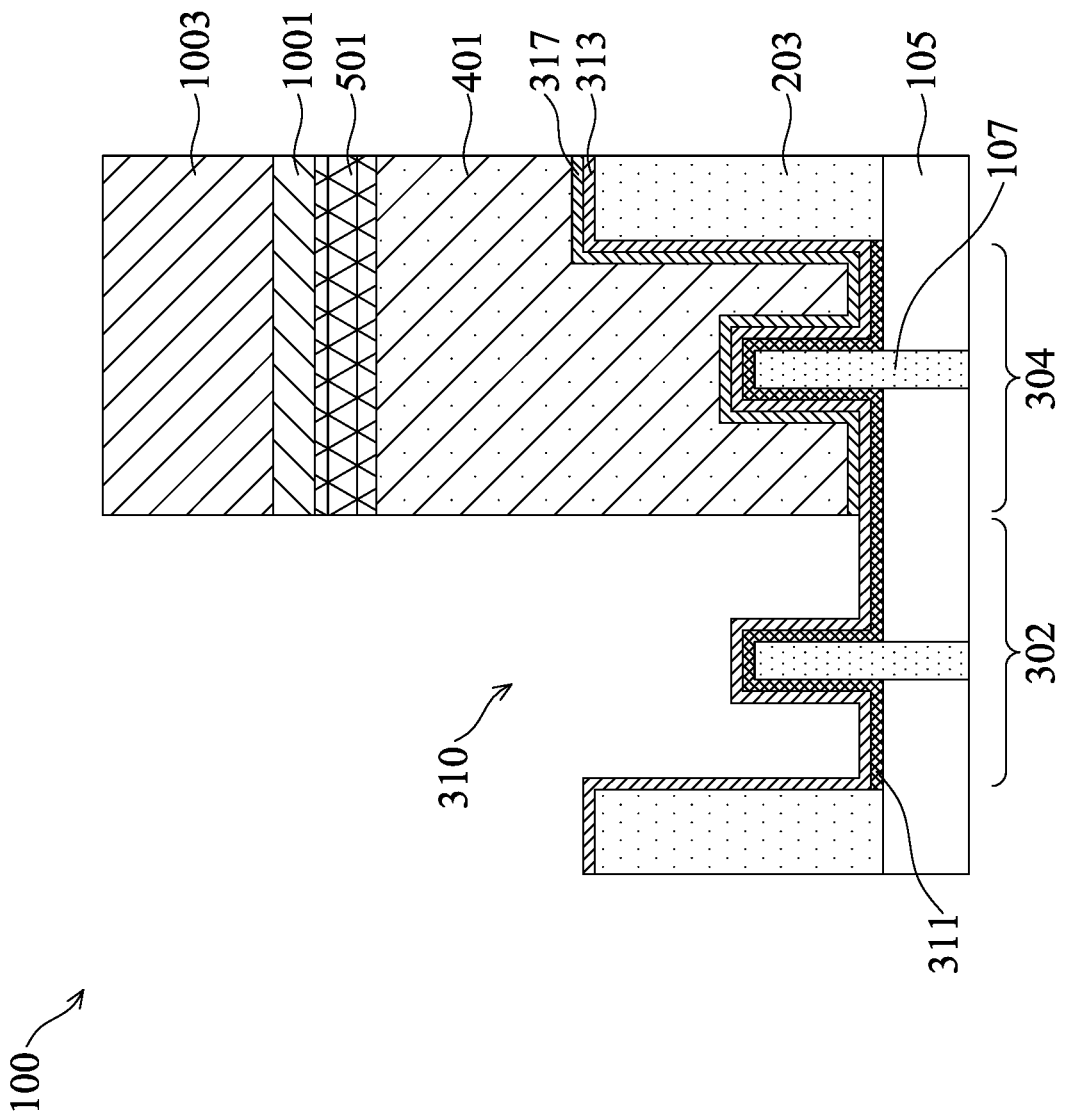

FIG. 13 illustrates removal of the first p-metal work function layer 317 from the first region 302 but not from the second region 304. Once the first p-metal work function layer 317 has been exposed in the first region 302, the first p-metal work function layer 317 in the first region 302 may be removed. In an embodiment the first p-metal work function layer 317 may be removed in the first region 302 utilizing one or more etching process, such as a wet etching process or a dry etching process that is selective to the material of the first p-metal work function layer 317 (e.g., titanium nitride) and which stops without significantly removing the material of the underlying first dielectric material 313 or the first metal material (e.g., tantalum nitride) if included. However, any suitable removal process may be utilized.

Figure 14:
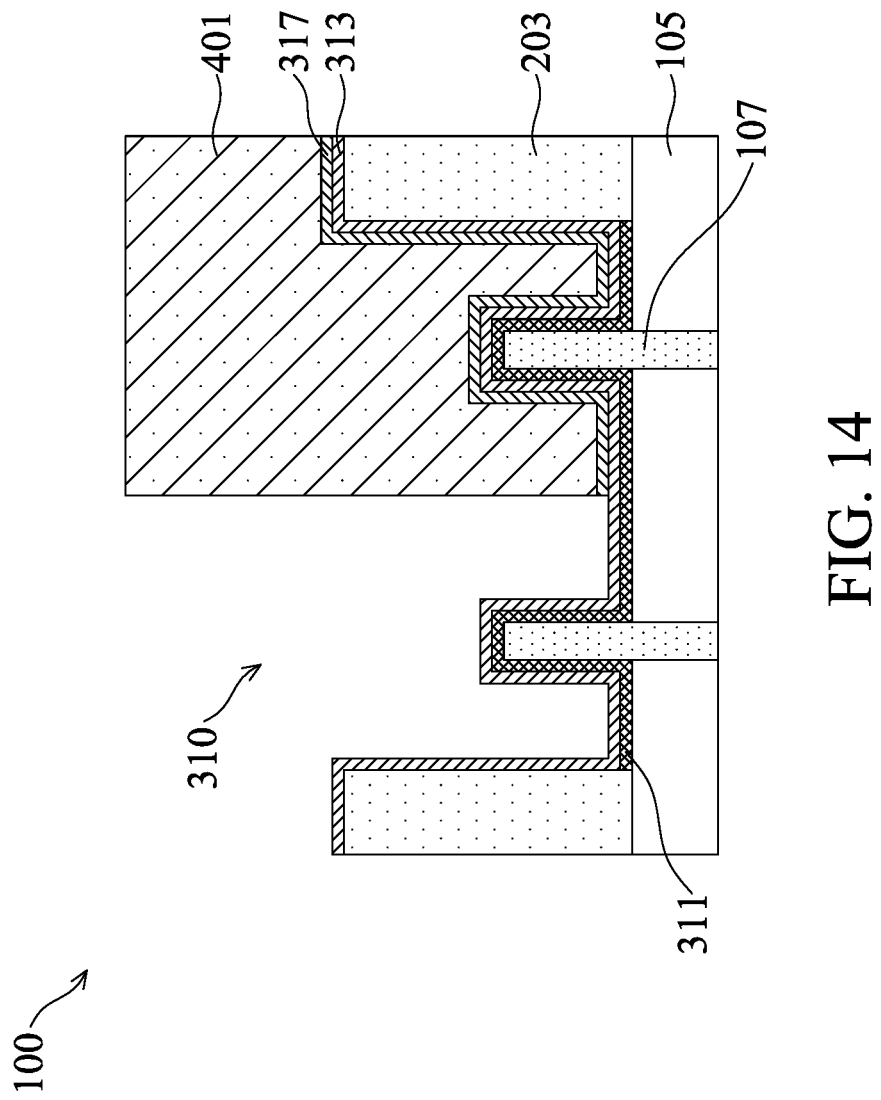

FIG. 14 illustrates that, once the first p-metal work function layer 317 has been removed, the remaining portions of the photoresist layer 1003, the ARC layer 1001, and the hardmask layer 501 may be removed from the second region 304. In some embodiments, these layers are removed, individually or in combination, and may be removed using a process such as ashing, whereby a temperature of the layer(s) is increased until the layer(s) experiences a thermal decomposition and can be removed. In another embodiment, the layer(s) may be removed by wet or dry etching with a suitable etchant. However, any suitable process may be utilized in order to remove these layers.

Figure 15:
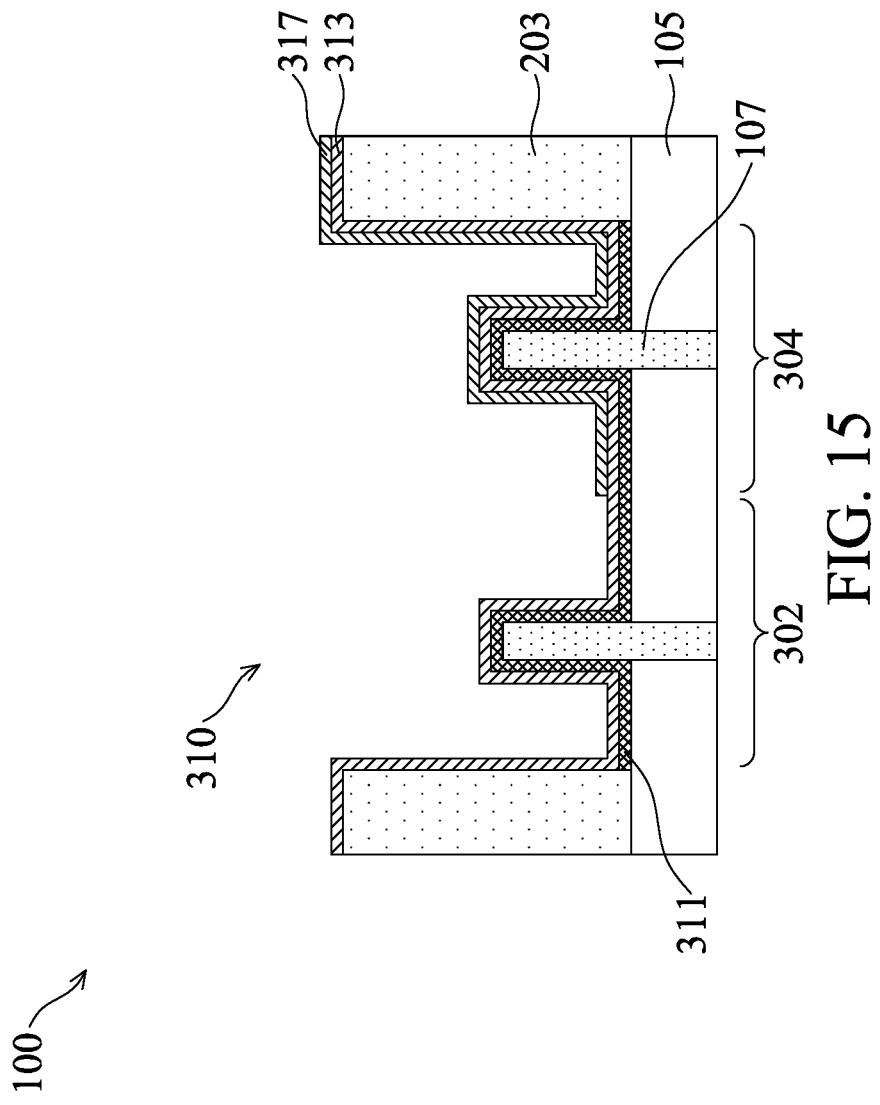

FIG. 15 illustrates that, once the photoresist layer 1003, the ARC layer 1001, and the hardmask layer 501 have been removed, the BARC layer 401 may be removed from over the second region 304. In some embodiments, similarly, the BARC layer 401 may be removed using a process such as ashing, whereby a temperature of the layer(s) is increased until the layer(s) experiences a thermal decomposition and can then be removed. Alternatively, the layer(s) may be removed by wet or dry etching with a suitable etchant. However, any other suitable process may be utilized in order to remove those layers. In some embodiments, the BARC layer 401 is removed at the same time and in the same process steps as one or more of the overlying layers.

Although not specifically illustrated, after the BARC layer 401 has been removed, another conductive material (e.g., a second p-metal work function layer) may be deposited over the first region 302 and the second region 304. In an embodiment the second p-metal work function layer may be a metal with a work function that is higher than or close to the material of the first p-metal work function layer 317 (e.g., TiN), as well as having a large selectivity to an etching process with the material of the first p-metal work function layer 317. Similar patterning processes as described above may be used to remove the second p-metal work function layer from other regions. However, any suitable removal process may be utilized. Accordingly, other metal layers may be formed and patterned in similar or different ways to form the gate stacks (e.g., the first gate stack 1603 and the second gate stack 1604) in the first region 302, the second region 304, and any other regions.

Figure 16:
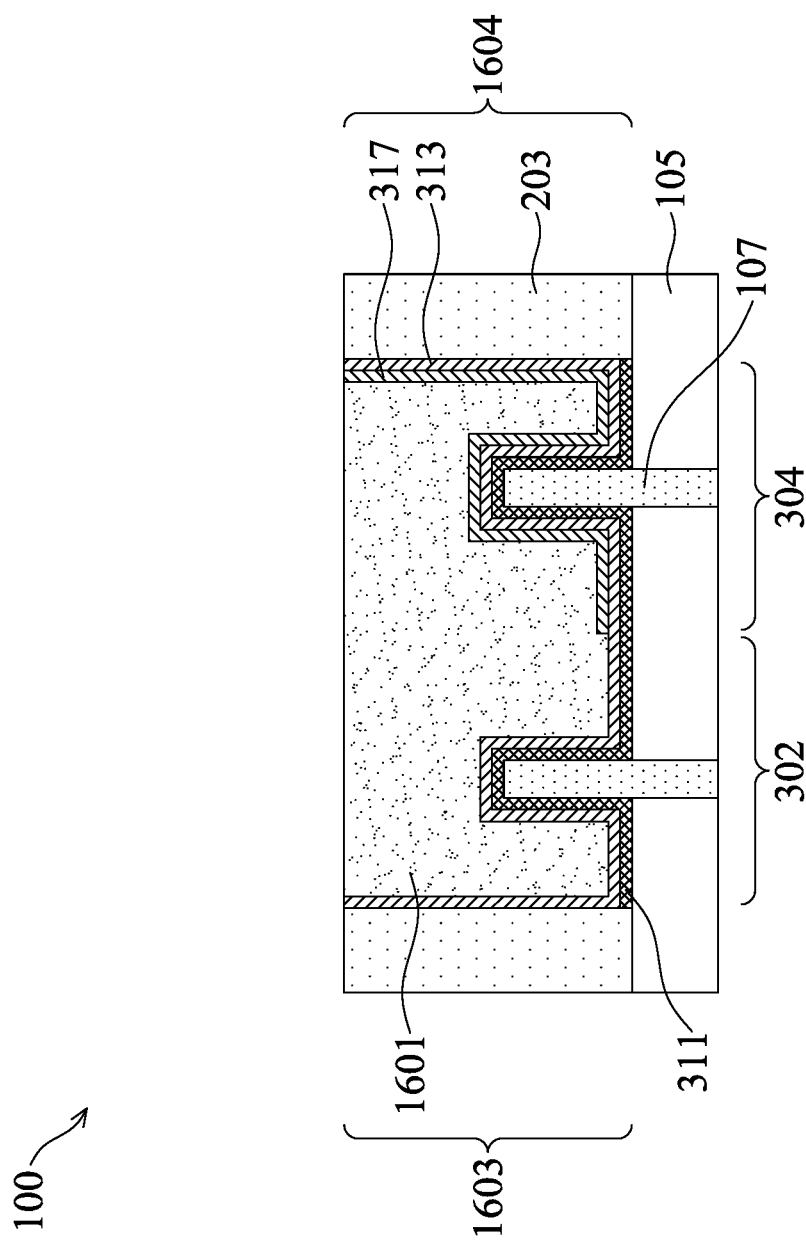

FIG. 16 illustrates that a fill material 1601 may be formed in the openings 310 to form remainders of the gate stacks. The fill material 1601 may be a material such as tungsten, Al, Cu, AlCu, W, Ti, TiAlN, TaC, TaCN, TaSiN, Mn, Zr, TiN, Ta, TaN, Co, Ni, combinations of these, or the like, and may be formed using a deposition process such as plating, chemical vapor deposition, atomic layer deposition, physical vapor deposition, combinations of these, or the like. However, any suitable material and process may be utilized.

After the fill material 1601 has been deposited to fill and overfill the openings 310, the materials within each of the openings 310 of the first region 302, the second region 304, and any other regions may be planarized to form the various gate stacks. In some embodiments, the materials may be planarized with the first spacers 113 and the first ILD layer 203 using, for example, a chemical mechanical polishing process, although any suitable process, such as grinding or etching, may be utilized. Contact plugs (not specifically illustrated) may be formed to electrically couple the various gate stacks and source and drain regions for those gate stacks to an overlying interconnect structure to be discussed below.

In reference to the various ALD deposition steps described above, it should be noted that those processes and preparation steps (e.g., for the deposition chamber 601) may be performed in connection with other ALD deposition steps in the fabrication of a semiconductor device not specifically referenced herein. For example, other ALD deposition steps that may benefit from these processes and preparation steps include wafer uniformality, production yield, and products reliability.

Also, it should be noted that the various semiconductor fabrication steps and preparation steps for the deposition chamber 601 may be performed in different orders. For example, before any wafers 100 undergo deposition, the deposition chamber 601 may be treated as described above with forming a protective coat 701, performing a treatment process (e.g., a water treatment) on the protective coat 701, and forming a hydrophobic coat 901. After these treatments, the wafer 100 may be placed into the deposition chamber for deposition of, for example, a metal oxide such as aluminum oxide.

Each deposition process for a given wafer 100 may comprise a first number $N_1$ of cycles, each of which including a sub-cycle of an oxygen precursor (e.g., water) and a sub-cycle of a metal precursor (e.g., an aluminum precursor like TMA). Indeed, a plurality of wafers 100, such as a second number $N_2$ of wafers 100, may undergo the deposition process before additional preparation steps are performed on the deposition chamber 601. Generally, a total number $N_T$ of deposition cycles may be calculated as a product of the first number $N_1$ and the second number $N_2$ after a plurality of wafers 100 (e.g., $N_2$ number of wafers 100 in series) have separately undergone the deposition process. Alternatively, the first number $N_1$ for each wafer 100 may be summed together to calculate the total number $N_T$ of deposition cycles.

When the total number $N_T$ of deposition cycles reaches a predetermined number, additional preparation steps may be performed on the deposition chamber 601 before any further deposition processes on any wafers 100. After repeated cycles, the hydrophobic coat 901 may have deteriorated to some degree exposing portions of the underlying protective coat 701. Optionally, the treatment process may be performed to increase the number of hydroxyl groups along any exposed portions of the protective coat 701. The hydrophobic precursor may then be flowed through the deposition chamber 601 to replenish portions of the hydrophobic coat 901 that may have deteriorated.

Following the additional treatment to the deposition chamber 601, the deposition processes may resume on more wafers 100. Similarly, a new total number $N_T$ of deposition cycles may be performed before performing the additional treatment to the deposition chamber 601 as described above. In some cases, the new total number $N_T$ of deposition cycles between treatments of the deposition chamber 601 may decrease throughout the longevity of the ALD system 600, the longevity of the deposition chamber 601, and/or even the longevity of the protective coat 701 and hydrophobic coat 901.

The embodiments described herein are advantageous because, as electronic components in semiconductor devices continue to be designed with increasingly reduced sizes, the material layers that comprise those components may also need to be thinner. As such, certain thin film deposition techniques, such as ALD processes and other types of CVD processes, have become increasingly useful throughout the semiconductor fabrication process. Indeed, the rate of growth per sub-cycle may be less than one atom in thickness due to the orientations of the atoms in a stable chemical structure. A material layer may, therefore, require many cycles to be completed to the desired thickness.

While the overall time consumption of using ALD tools is important for their contribution to the total fabrication time for a semiconductor device, the time and monetary costs for maintenance and replacement of those ALD tools also become factors to be mindful of. A particular ALD tool may be more prone to requiring extra cleaning or quicker replacement if, for example, the deposition cycles that it performs tend to form layers of the desired material on and inside the showerhead and on the inner sidewalls of the ALD tool itself. Accordingly, preparation measures that would prevent or reduce the rate of deposition of those materials on the ALD tool will improve the longevity of the ALD tool while also increasing the proportion of time that the ALD tool can be in use rather than undergoing maintenance or replacement.

As described above, the semiconductor fabrication process may integrate the above-described relatively expeditious preparation measures for a particular ALD tool. These preparation steps would be conducted before use of the ALD tool for certain deposition steps. Some preparation measures may be performed to form a protective coat over the inner sidewalls and showerhead of the ALD tool. The protective coat may prevent or reduce the deposition of materials onto the inner sidewalls and showerhead of the ALD tool during use in the semiconductor fabrication process. Additional preparation measures may be performed to form a hydrophobic coat over the protective coat. The hydrophobic coat may further prevent or reduce the deposition of materials onto the inner sidewalls and showerhead of the ALD tool during use in the semiconductor fabrication process.

After a certain number of ALD deposition cycles used in the semiconductor fabrication process, one or both of the preparation measures may be performed again on the ALD tool to rebuild or maintain the protective coat and/or the hydrophobic coat. As a result of these various measures, the overall yield of the ALD processes may improve due to reducing incidental depositions on surfaces other than the wafer, the longevity of the ALD tool may increase, and the amount of time spent on preventative maintenance and repair measures on the ALD tool may decrease.

In an embodiment, a method of manufacturing a semiconductor device includes preparing a deposition processing chamber, the preparing includes flowing first precursors to form a dielectric coat along an inner sidewall of the deposition processing chamber; and flowing a second precursor to form a hydrophobic layer over the dielectric coat; performing one or more deposition cycles; and after performing the one or more deposition cycles, flowing the second precursor to repair the hydrophobic layer. In an embodiment, the first precursors include a silicon precursor and a first oxygen precursor. In an embodiment, each of the one or more deposition cycles includes flowing a second oxygen precursor; and flowing a metal precursor. In an embodiment, the second precursor includes a fluorinated hydrocarbon functional group. In an embodiment, the dielectric coat includes silicon oxide. In an embodiment, the one or more deposition cycles form aluminum oxide. In an embodiment, the one or more deposition cycles forms an aluminum oxide layer, which may be used as, for example, a hardmask, to pattern one or more underlying layers.

In another embodiment, a method of forming a semiconductor device includes depositing a metal oxide layer over a wafer, the depositing the metal oxide layer includes depositing a silicon oxide coat over an inner sidewall of a processing chamber; flowing a hydrophobic precursor into the processing chamber to form a hydrophobic layer over the silicon oxide coat; after flowing the hydrophobic precursor, placing the wafer into the processing chamber; flowing an oxygen precursor over the wafer; flowing a metal precursor over the wafer; and patterning the metal oxide layer. In an embodiment, the metal oxide layer includes aluminum oxide. In an embodiment, the hydrophobic layer is bonded to the silicon oxide coat. In an embodiment, the steps of flowing the oxygen precursor over the wafer and flowing the metal precursor over the wafer are performed a predetermined number of times in alternating fashion. In an embodiment, the method further includes, after the predetermined number of times removing the wafer from the processing chamber; and repeating the step of flowing the hydrophobic precursor. In an embodiment, the hydrophobic precursor is a fluorinated hydrocarbon. In an embodiment, the depositing a metal oxide layer over the wafer further includes depositing the silicon oxide coat within openings in a showerhead of the processing chamber; and forming the hydrophobic layer over the silicon oxide coat within the openings in the showerhead of the processing chamber. In an embodiment, the method further includes, before the flowing the hydrophobic precursor, flowing water over the silicon oxide coat.

In yet another embodiment, a method of manufacturing a semiconductor device includes performing first processing steps on a first wafer; performing a first treatment process on an ALD tool includes forming a hydrophobic coat over inner sidewalls of the ALD tool; placing the first wafer into the ALD tool; performing a first ALD process on the first wafer; removing the first wafer from the ALD tool; performing second processing steps on a second wafer; after removing the first wafer from the ALD tool, placing the second wafer into the ALD tool; performing a second ALD process on the second wafer; removing the second wafer from the ALD tool; and after removing the second wafer from the ALD tool, performing a second treatment process on the ALD tool includes replenishing the hydrophobic coat over the inner sidewalls of the ALD tool. In an embodiment, the performing the first treatment process includes flowing silicon oxide precursors to form a silicon oxide coat over the inner sidewalls of the ALD tool; and flowing a hydrophobic precursor to form a hydrophobic coat over the silicon oxide coat. In an embodiment, the performing the second treatment process includes flowing the hydrophobic precursor to replenish the hydrophobic coat. In an embodiment, the first ALD process includes depositing a metal oxide layer as part of a photoresist. In an embodiment, the first ALD process includes depositing a metal oxide layer as part of an etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   preparing a deposition processing chamber, the preparing comprising:
      flowing first precursors to form a dielectric coat along an inner sidewall of the deposition processing chamber; and
      flowing a second precursor to form a hydrophobic layer over the dielectric coat;
   performing one or more deposition cycles; and
   after performing the one or more deposition cycles, flowing the second precursor to repair the hydrophobic layer.

2. The method of claim 1, wherein the first precursors comprise a silicon precursor and a first oxygen precursor.

3. The method of claim 2, wherein each of the one or more deposition cycles comprises:
   flowing a second oxygen precursor; and
   flowing a metal precursor.

4. The method of claim 1, wherein the second precursor comprises a fluorinated hydrocarbon functional group.

5. The method of claim 4, wherein the dielectric coat comprises silicon oxide.

6. The method of claim 1, wherein the one or more deposition cycles form aluminum oxide.

7. The method of claim 6, wherein the aluminum oxide comprises a hardmask for patterning.

8. A method of forming a semiconductor device, the method comprising:
   depositing a metal oxide layer over a wafer, the depositing the metal oxide layer comprising:
      depositing a silicon oxide coat over an inner sidewall of a processing chamber;
      flowing a hydrophobic precursor into the processing chamber to form a hydrophobic layer over the silicon oxide coat;
      after flowing the hydrophobic precursor, placing the wafer into the processing chamber;
      flowing an oxygen precursor over the wafer;
      flowing a metal precursor over the wafer; and
   patterning the metal oxide layer.

9. The method of claim 8, wherein the metal oxide layer comprises aluminum oxide.

10. The method of claim 8, wherein the hydrophobic layer is bonded to the silicon oxide coat.

11. The method of claim 8, wherein the steps of flowing the oxygen precursor over the wafer and flowing the metal precursor over the wafer are performed a predetermined number of times in alternating fashion.

12. The method of claim 11 further comprising, after the predetermined number of times:
   removing the wafer from the processing chamber; and
   repeating the step of flowing the hydrophobic precursor.

13. The method of claim 8, wherein the hydrophobic precursor is a fluorinated hydrocarbon.

14. The method of claim 8, wherein the depositing a metal oxide layer over the wafer further comprises:
   depositing the silicon oxide coat within openings in a showerhead of the processing chamber; and
   forming the hydrophobic layer over the silicon oxide coat within the openings in the showerhead of the processing chamber.

15. The method of claim 8 further comprising, before the flowing the hydrophobic precursor, flowing water over the silicon oxide coat.

16. A method of manufacturing a semiconductor device, the method comprising:
   performing first processing steps on a first wafer;
   performing a first treatment process on an ALD tool comprising forming a hydrophobic coat over inner sidewalls of the ALD tool;
   placing the first wafer into the ALD tool;
   performing a first ALD process on the first wafer;
   removing the first wafer from the ALD tool;
   performing second processing steps on a second wafer;
   after removing the first wafer from the ALD tool, placing the second wafer into the ALD tool;
   performing a second ALD process on the second wafer;
   removing the second wafer from the ALD tool; and
   after removing the second wafer from the ALD tool, performing a second treatment process on the ALD tool comprising replenishing the hydrophobic coat over the inner sidewalls of the ALD tool.

17. The method of claim 16, wherein the performing the first treatment process comprises:
   flowing silicon oxide precursors to form a silicon oxide coat over the inner sidewalls of the ALD tool; and
   flowing a hydrophobic precursor to form a hydrophobic coat over the silicon oxide coat.

18. The method of claim 17, wherein the performing the second treatment process comprises flowing the hydrophobic precursor to replenish the hydrophobic coat.

19. The method of claim 16, wherein the first ALD process comprises depositing a metal oxide layer as a hardmask for patterning.

20. The method of claim 16, wherein the first ALD process comprises depositing a metal oxide layer as part of an etch stop layer.

* * * * *